United States Patent [19]

Norimatsu

[11] Patent Number: 5,790,061
[45] Date of Patent: Aug. 4, 1998

[54] ADAPTIVE A/D CONVERTING DEVICE FOR ADAPTIVELY CONVERTING AND INPUT ANALOG SIGNAL INTO AN OUTPUT DIGITAL SIGNAL HAVING A CONSTANT QUANTIZING ERROR

[75] Inventor: Hidehiko Norimatsu, Tokyo, Japan

[73] Assignee: NEC Corporation, Japan

[21] Appl. No.: 604,835

[22] Filed: Feb. 22, 1996

[30] Foreign Application Priority Data

Feb. 24, 1995 [JP] Japan ................... 7-062033

[51] Int. Cl.[6] .................................................. H03M 1/34
[52] U.S. Cl. ........................................ 341/139; 341/120
[58] Field of Search .............................. 341/139, 155, 341/118, 120

[56] References Cited

U.S. PATENT DOCUMENTS

| | | |
|---|---|---|
| 3,411,153 | 11/1968 | Steele . |
| 4,251,802 | 2/1981 | Horna ............................ 341/156 |
| 4,642,694 | 2/1987 | Yamagishi et al. ................ 348/790 |
| 4,749,984 | 6/1988 | Prost et al. ....................... 341/156 |
| 4,823,130 | 4/1989 | Wright et al. .................... 341/157 |
| 4,831,382 | 5/1989 | Debus, Jr. et al. ................ 341/200 |
| 5,389,927 | 2/1995 | Turney et al. .................... 341/139 |

FOREIGN PATENT DOCUMENTS

| | | |
|---|---|---|
| 0180969 | 5/1986 | European Pat. Off. . |
| 63-250918 | 10/1988 | Japan . |
| 3-129585 | 6/1991 | Japan . |

*Primary Examiner*—Jeffrey A. Gaffin
*Assistant Examiner*—Peguy JeanPierre
*Attorney, Agent, or Firm*—Ostrolenk, Faber, Gerb & Soffen, LLP

[57] ABSTRACT

In an adaptive A/D converting device for adaptively converting an input analog signal (Vin) into an output digital signal (Dout), a reference voltage generating unit (11) generates lower and higher limit reference voltages (Vrl, Vrh) with a predetermined difference voltage (Vd) kept therebetween. A main A/D conversion unit (12) converts the input analog signal into an original digital signal (Dor) having a constant quantizing error. A control section (13) controls the lower and the higher limit reference voltages so that the input analog voltage always lies in an observation allowable range defined therebetween. A modifying section (14) modifies the original digital signal into the output digital signal having the constant quantizing error.

24 Claims, 14 Drawing Sheets

ADAPTIVE A/D CONVERTING DEVICE FOR ADAPTIVELY CONVERTING AND INPUT ANALOG SIGNAL INTO AN OUTPUT DIGITAL SIGNAL HAVING A CONSTANT QUANTIZING ERROR

BACKGROUND OF THE INVENTION

This invention relates to an adaptive analog-to-digital converting device and, more particularly, to an adaptive analog-to-digital converting device with a controllable dynamic range.

As is well known in the art, analog-to-digital (A/D) converting devices are devices each of which converts an input analog signal into an output digital signal. As one of the A/D converting devices is known an adaptive A/D converting device for adaptively converting the input analog signal into the output digital signal. Such an adaptive A/D converting device has a controllable dynamic range. As a result, the adaptive A/D converting device is used for application where the controllable dynamic range is required to be expanded.

Various adaptive A/D converting devices of the type are already known. By way of example, an adaptive A/D converting device is disclosed in Japanese Unexamined Patent Prepublication of Kokai No. Hei 3-129,585, namely, 129,585/1991. According to Kokai No. Hei 3-129,585, the adaptive A/D converting device is for use in an article detecting system. The article detecting system expands a dynamic range without using a high power supply and properly detects an article from the intensity of reflected light even if the intensity of disturbance light is strong by previously monitoring the disturbance light and selecting a sensitivity level of a photoelectric conversion unit and a reference voltage for an A/D conversion unit. More specifically, the article detecting system is provided with the photoelectric conversion unit capable of selecting one of a plurality of sensitivity levels and a reference voltage generating unit capable of selecting one of a plurality of reference voltages. A control section monitors the output of the A/D conversion unit to be the intensity of disturbance light prior to detection of the article and selects one of the sensitivity levels and one of the reference voltages. A combination of the A/D conversion unit, the reference voltage generating unit, and the control unit serves as the adaptive A/D converting device. With this structure, it is possible to expand the dynamic range without using the high power supply. When the intensity of disturbance light is strong, the photoelectric conversion unit is switched to a low sensitivity level side and the A/D conversion unit is switched to a low reference voltage side to expand the dynamic range.

However, the adaptive A/D converting device cannot expand the controllable dynamic range in real time. This is because the control section must monitor the output of the A/D conversion unit to be the intensity of the disturbance light prior to detection of the article. In addition, the A/D conversion unit merely produces, as the output thereof, a signal indicative of an input relative numerical value which represents an input relative level of the input analog signal. This is because the output of the A/D conversion unit has a larger quantizing error when the adaptive A/D converting device has an expanded dynamic range by supplying a high reference voltage from the reference voltage generating unit to the A/D conversion unit. In other words, the output of the A/D conversion unit has a wider width of quantization step when the high reference voltage is supplied to the A/D conversion unit.

Another adaptive A/D converting device is disclosed in Japanese Unexamined Patent Prepublication of Kokai No. Sho 63-250,918, namely, 250,918/1988. The adaptive A/D converting device according to Kokai No. Sho 63-250,918 enables a dynamic range to be set arbitrarily and realizes high sensitivity and low cost, by supplying an input reference voltage from both sides of a resistance ladder circuit which forms a plurality of reference potentials, and changing the voltage value of the input reference voltage gradually according to the level of an input analog signal. More specifically, a range control circuit monitors an output digital signal supplied from an encoder, forms a range control signal, and supplies it to a reference voltage switching circuits. When the input analog signal has the amplitude which exceeds the relatively small absolute values of the low reference voltages, the range control signal is set a low level. When it is less than the relatively small absolute values of the low reference voltage, the range control signal is set at a high level. Therefore, to the resistance ladder circuit in an A/D conversion unit, the high reference voltages having relatively large absolute values or the low reference voltage having relatively small absolute values are supplied. Therefore, the adaptive A/D converting device has the dynamic range of a high or a low level.

However, the adaptive A/D converting device has a coarse resolution of quantization or the output digital signal has a larger quantizing error when the adaptive A/D converting device has the expanded dynamic range. This is because the high reference voltage having the relatively large absolute value is supplied to both side of the resistance ladder circuit and then the reference potentials have a wider potential interval. In addition, the adaptive A/D converting devices also produces the output digital signal indicative of a relative level of the input analog signal. As a result, an input absolute level of the input analog signal must be estimated in a reception side for receiving the output digital signal.

SUMMARY OF THE INVENTION

It is therefore an object of this invention to provide an adaptive analog-to-digital converting device which is capable of always producing an output digital signal having a constant quantizing error although a controllable dynamic range changes to be expanded.

It is another object of this invention to provide an adaptive analog-to-digital converting device of the type described, which is capable of changing the controllable dynamic range in real time.

It is still another object of this invention to provide an adaptive analog-to-digital converting device of the type described, which is capable of producing an output digital signal indicative of an input absolute numerical value which represents an input absolute level of an input analog signal.

Other objects of this invention will become clear as the description proceeds.

On describing the gist of an aspect of this invention, it is possible to understand that an adaptive analog-to-digital converting device adaptively converts an input analog signal indicative of an input analog voltage into an output digital signal indicative of an output numerical value which corresponds to the input analog voltage.

According to this invention, the above-understood adaptive analog-to-digital converting device comprises a reference voltage generating unit for generating, as a controllable reference voltage, a pair of lower and higher limit reference voltages with a predetermined difference voltage kept therebetween in response to a control signal. Supplied with the input analog signal and connected to the reference voltage generating unit, a main analog-to-digital conversion unit converts, on the basis of the lower and higher limit reference voltages, the input analog signal into an original digital signal indicative of an input relative numerical value which represents an input relative level deviated from an input reference level of the input analog signal. The original digital signal has a constant quantizing error. Connected to the main analog-to-digital conversion unit and the reference voltage generating unit, a control section controls, on the basis of the original digital signal, the lower and the higher limit reference voltages by supplying the control signal to said reference voltage generating unit. Therefore, the input analog voltage of the input analog signal always lies in an observation allowable range defined between the lower and the higher limit reference voltages.

Preferably, the above-understood adaptive analog-to-digital converting device may further comprise a modifying section connected to the main analog-to-digital conversion unit and the reference voltage generating unit. On the basis of the controllable reference voltage, the modifying section modifies the original digital signal into a modified digital signal indicative of an input absolute numerical value which represents an input absolute level of the input analog signal. The input absolute level is equal to the input relative level plus the input reference level. The modifying section produces the modified digital signal as the output digital signal. Therefore, the adaptive analog-to-digital converting device always produces the output digital signal having the constant quantizing error although the input analog signal has an amplitude which changes drastically, thereby apparently expanding a dynamic range of the adaptive analog-to-digital converting device.

DESCRIPTION OF THE PREFERRED EMBODIMENTS

Figure 1:
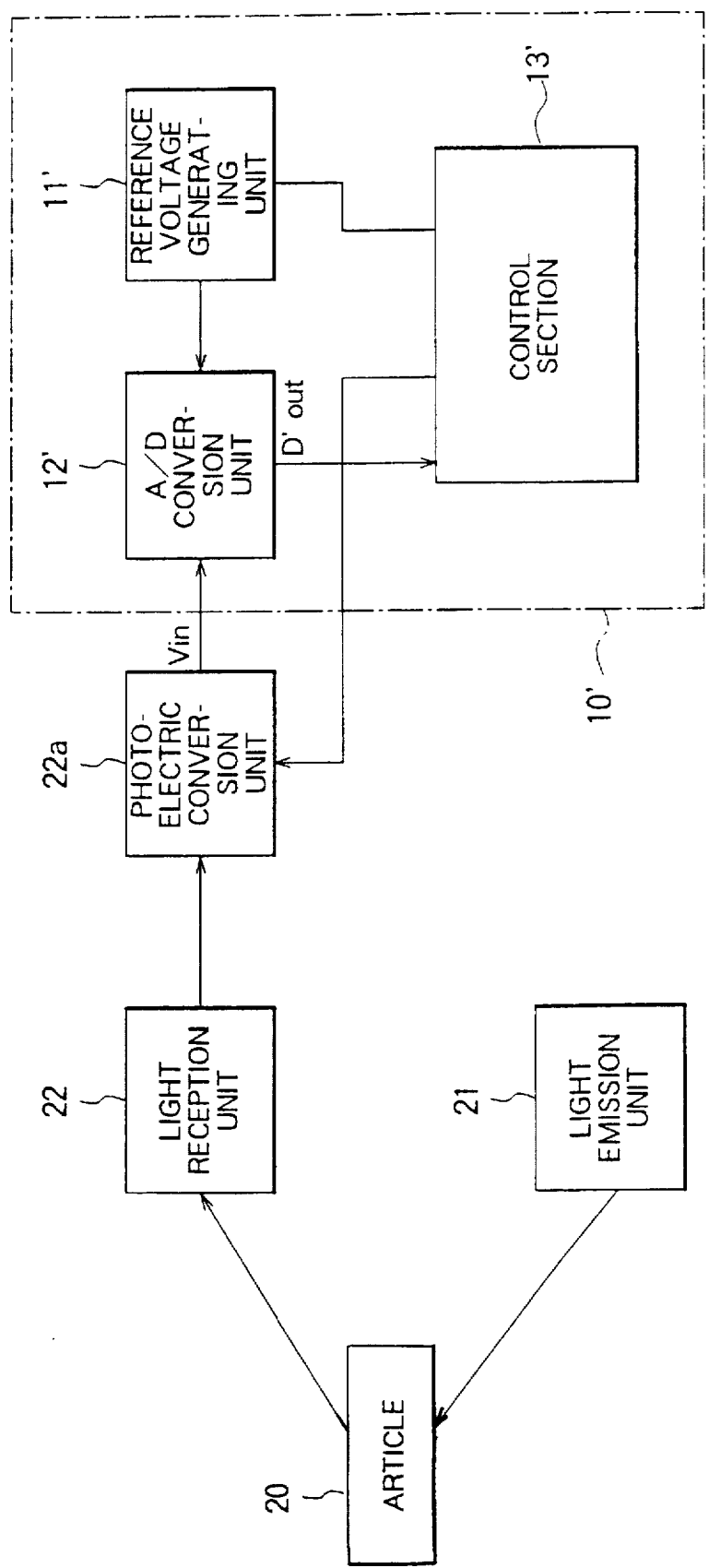
FIG. 1 is a block diagram of a first conventional adaptive A/D converting device for use in an article detecting system.

Referring to FIG. 1, a first conventional adaptive analog-to-digital (A/D) converting device 10' will be described in order to facilitate an understanding of this invention. The illustrated adaptive A/D converting device 10' is disclosed in the above-mentioned Japanese Unexamined Patent Prepublication of Kokai No. Hei 3-129,585. The adaptive A/D converting device 10' has a controllable dynamic range and adaptively converting an input analog signal Vin indicative of an input analog voltage into an output digital signal D'out indicative of an output numerical value which corresponds to the input analog voltage.

The adaptive A/D converting device depicted at 10' is for use in an article detecting system. The illustrated article detecting system is a system for detecting an article 20. The article detecting system comprises a light emission unit 21 for emitting detection light in a detection space including the article 20, a light reception unit 22 for receiving reflected light from the detection space to produce a received light signal indicative of a received light amount, and a photoelectric conversion unit 22a for carrying out photoelectric conversion on the received light signal to produce the input analog signal Vin. The photoelectric conversion unit 22a has a plurality of sensitivity levels. The input analog signal Vin is supplied to the adaptive A/D converting device 10'.

The adaptive A/D converting device 10' comprises a reference voltage generating unit 11', an A/D conversion unit 12', and a control unit 13'. The reference voltage generating unit 11' has a plurality of reference voltages and generates one of the reference voltages as a selected reference voltage. The A/D conversion unit 12' converts, on the basis of the selected reference voltage, the input analog signal Vin into the output digital signal D'out. As a result, it is possible to change the controllable dynamic range by selecting the reference voltages. The output digital signal D'out is supplied to the control unit 13'. The control unit 13' detects variation in the received light amount with reference to the output digital signal D'out to detect the article 20.

The control section 13' monitors the output digital signal D'out based on the intensity of disturbance light prior to detection of the article 20 and selects one of the sensitivity levels in the photoelectric conversion unit 22a and one of the reference voltages in the reference voltage generating unit 11'.

With this structure, it is possible to expand the controllable dynamic range without using a high power supply and to properly detect the article 20 from the intensity of the reflected light even if the intensity of the disturbance light is strong. When the intensity of the disturbance light is strong, the photoelectric conversion unit 22a is switched to a lower sensitivity level and the A/D conversion unit 12' is supplied with a lower reference voltage from the reference voltage generating unit 11' to expand the controllable dynamic range.

However, the adaptive A/D converting device 10' cannot change the controllable dynamic range in real time, as mentioned in the preamble of the instant specification. This is because the control section 13' must monitor the output digital signal D'out based on the intensity of the disturbance light prior to detection of the article 20.

In addition, the A/D conversion unit 12' merely produces, as the output digital signal D'out, a signal indicative of an input relative numerical value which represents an input relative level of the input analog signal Vin. This is because the output digital signal D'out has a larger quantizing error when the adaptive A/D converting device 10' has an expanded dynamic range by supplying a high reference voltage from the reference voltage generating unit 11' to the A/D conversion unit 12', as also mentioned in the preamble of the instant specification. In other words, the output digital signal D'out has a wider width of quantization step when the high reference voltage is supplied to the A/D conversion unit 12'. In the instant specification, the input relative numerical value is also called herein as an input virtual numerical value or an input logical numerical value. In addition, the input relative level is also referred to as an input virtual level or an input logical level.

Furthermore, inasmuch as the output digital signal D'out merely indicates the input relative numerical value, the control section 13' receiving the output digital signal D'out must calculate an input absolute numerical value which represents an input absolute level of the input analog signal Vin if necessary. As a result, the control section 13' has a large overhead to calculate the input absolute numerical value, as further mentioned in the preamble of the instant specification. In the instant specification, the input absolute numerical value is also called herein as an input real numerical value or an input physical numerical value. In addition, the input absolute level is also referred to as an input real level or an input physical level.

Figure 2:
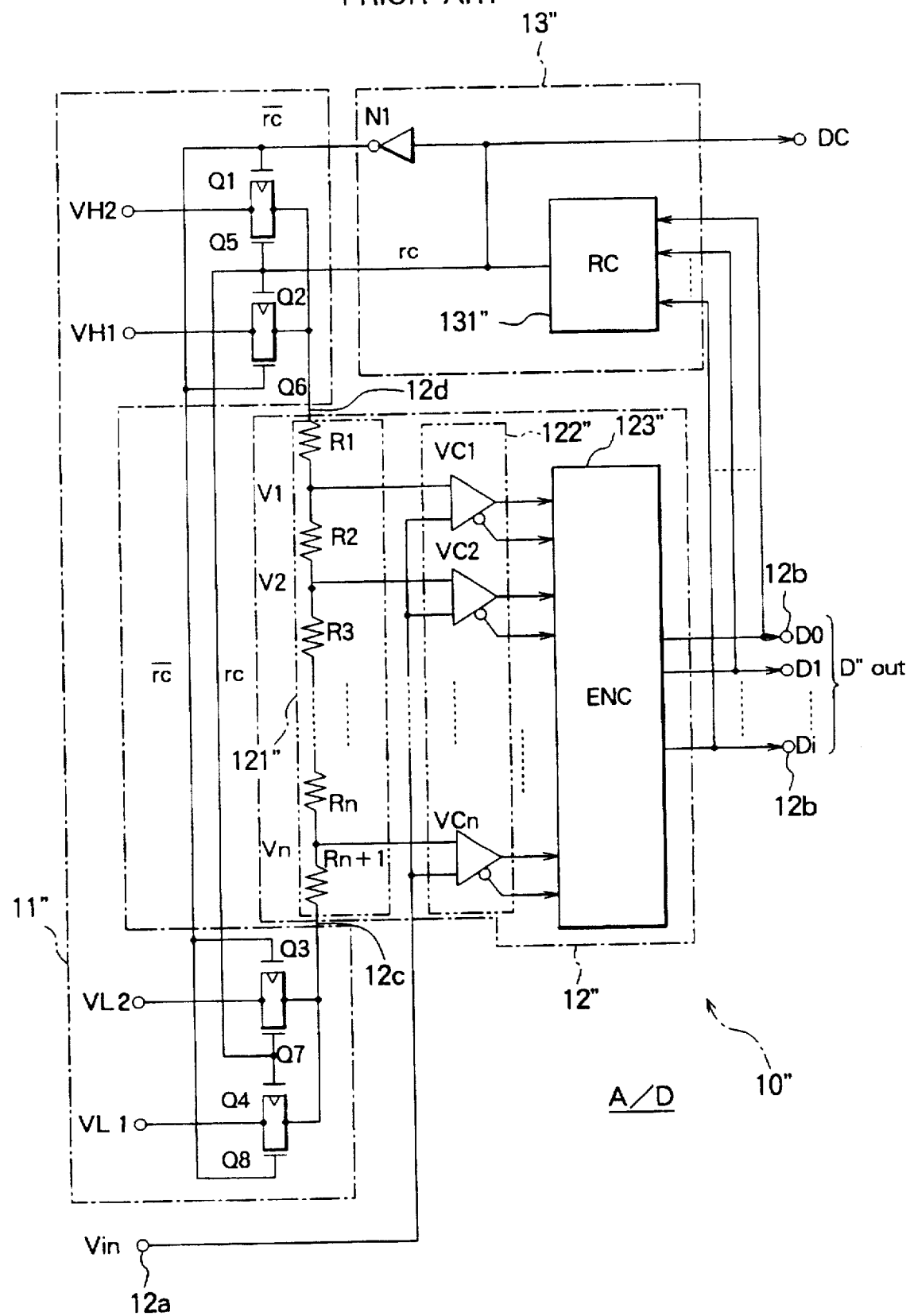
FIG. 2 is a block diagram of a second conventional adaptive A/D converting device.

Referring to FIG. 2, a second conventional adaptive A/D converting device 10" will be described in order to facilitate an understanding of this invention. The illustrated adaptive A/D converting device 10" is disclosed in the above-mentioned Japanese Unexamined Patent Prepublication of Kokai No. Sho 63-250,918.

Figure 3:
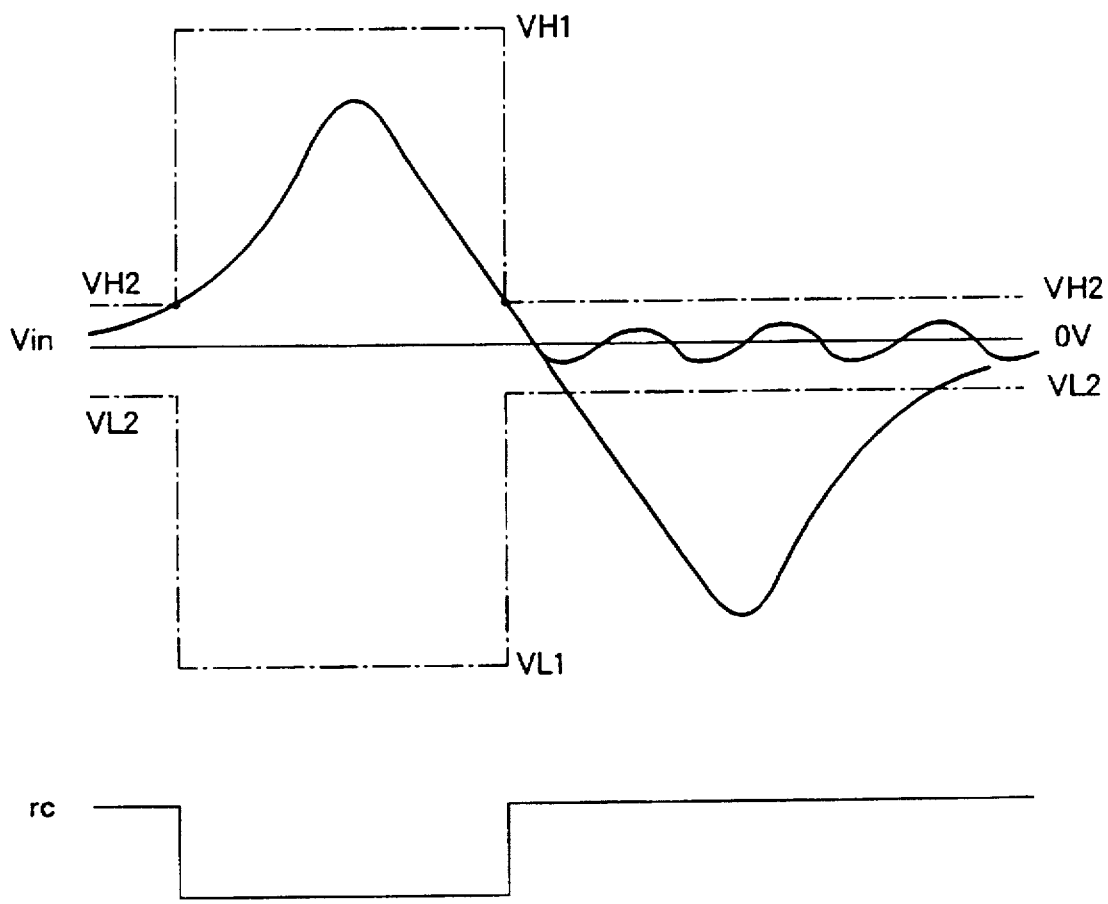
FIG. 3 shows a time chart for use in describing operation of the second conventional adaptive A/D converting device illustrated in FIG. 2.

The illustrated adaptive A/D converting device 10" comprises a reference voltage generating unit 11", an A/D conversion unit 12", and a control section 13". The reference voltage generating unit 11" generates a controllable reference voltage in the manner which will become clear as the description proceeds. The controllable reference voltage is supplied to the A/D converting unit 12" which is supplied with the input analog signal Vin. The A/D converting unit 12" converts, with reference to the controllable reference voltage, the input analog signal Vin into an output digital signal D"out which consists of (i+1) bits D0, D1, . . . , and Di where i represents a positive number. The output digital signal D"out is supplied to the control section 13". In the manner which will later become clear, the control section 13" controls the controllable reference voltage of the reference voltage generating unit 11" by supplying a control signal to the reference voltage generating unit More specifically, the reference voltage generating unit 11" has or supplied with first and second higher limit reference voltages VH1 and VH2 and first and second lower limit reference voltages VL1 and VL2. As shown in FIG. 3, the first higher limit reference voltage VH1 is a higher positive voltage while the second higher limit reference voltage VH2 is a lower positive voltage than the first higher limit reference voltage VH1. The first lower limit reference voltage VL1 is a lower negative voltage while the second lower limit reference voltage VL2 is a higher negative voltage than the first lower limit reference voltage VL1. In addition, both of the first higher limit reference voltage VH1 and the first lower limit reference voltage VL1 have a first absolute value while both of the second higher limit reference voltage VH2 and the second lower limit reference voltage VL2 have a second absolute value which is smaller than the first absolute value. The reference voltage generating unit 11" comprises a reference voltage switching circuit which consists of first through fourth P-channel metal oxide semiconductor field effect transistors (MOSFETs) Q1, Q2, Q3, and Q4 and first through fourth N-channel MOSFETs Q5, Q6, Q7, and Q8. The first P-channel MOSFET Q1 and the first N-channel MOSFET Q5 are connected in parallel to each other and are supplied with the second higher limit reference voltage VH2 while the second P-channel MOSFET Q2 and the second N-channel MOSFET Q6 are connected in parallel to each other and are supplied with the first higher limit reference voltage VH1. Likewise, the third P-channel MOSFET Q3 and the third N-channel MOSFET Q7 are connected in parallel to each other and are supplied with the second lower limit reference voltage VL2 while the fourth P-channel MOSFET Q4 and the fourth N-channel MOSFET Q8 are connected in parallel to each other and are supplied with the first lower limit reference voltage VL1. The reference voltage generating unit 11" generates, as the controllable reference voltage, either a pair of the first higher limit reference voltage VH1 and the first lower limit reference voltage VL1 or another pair of the second higher limit reference voltage VH2 and the second lower limit reference voltage VL2.

The A/D converting unit 12" has an input terminal 12a supplied with the input analog signal Vin, an output terminal 12b for outputting the output digital signal D"out, and lower and higher limit reference voltage input terminals 12c and 12d which are supplied with the lower and the higher limit reference voltages, respectively.

The A/D converting unit 12" comprises a resistance ladder circuit 121" consisting of first through (n+1)-th resistors R1, R2, R3, . . . , Rn, and Rn+1 which are connected in series to one another, where n represents a positive integer which is not less than two. The first resistor R1 has an end connected to the higher limit reference voltage input terminal 12d while the (n+1)-th resistor Rn+1 has an end connected to the lower limit reference voltage input terminal 12c. The resistance ladder circuit 121" forms first through n-th reference potentials V1, V2, . . . , and Vn. The A/D converting unit 12" comprises a voltage comparison section 122" consisting of first through n-th voltage comparison circuits VC1, VC2, . . . , and VCn. The first through the n-th voltage comparison circuit VC1 to VCn have input terminals supplied with the first through the n-th reference potentials V1 to Vn, respectively, and have another input terminals supplied with the input analog signal Vin in common. Each of the first through the n-th voltage comparison circuits VC1 to VCn has an inversion output terminal for outputting an inversion output signal and a non-inversion output terminal for outputting a non-inversion output signal. The inversion output signal and the non-inversion output signal from the first through the n-th voltage comparison circuits VC1 to VCn are supplied to an encoder 123". The encoder 123" encodes the inversion output signal and the non-inversion output signal from the first through the n-th voltage comparison circuits VC1 to VCn to produce the output digital signal D"out.

The control section 13" comprises a range control circuit 131" supplied with the output digital signal D"out. The range control circuit 131" monitors the output digital signal D"out to produce a range control signal rc. More specifically, the range control circuit .131" produces the range control signal rc indicative of a logic low level when the input analog signal Vin has an amplitude which exceeds the second absolute value of the the second higher limit reference voltage VH2 and the second lower limit reference voltage VL2. The range control circuit 131" produces the range control signal rc indicative of a logic high level when the input analog signal Vin has an amplitude which becomes smaller than the second absolute value of the the second higher limit reference voltage VH2 and the second lower limit reference voltage VL2. The control section 13" further comprises an inverter circuit NI for inverting the range control signal rc into an inverted range control signal $\overline{rc}$. Both of the range control signal rc and the inverted range control signal $\overline{rc}$ are supplied to the reference voltage switching circuit in the reference voltage generating unit 11". In addition, the range control signal rc, together with the output digital signal D"out, is supplied to a reception side (not shown) as an additional output digital signal DC. More particularly, the range control signal rc is supplied to the second and the fourth P-channel MOSFETs Q2 and Q4 and to the first and the third N-channel MOSFETs Q5 and Q7 while the inverted range control signal $\overline{rc}$ is supplied to the first and the third P-channel MOSFETs Q1 and Q3 and to the second and the fourth N-channel MOSFETs Q6 and Q8.

Turning to FIG. 3, description will be made as regards operation of the A/D converting device illustrated in FIG. 2. When the input analog signal Vin has the amplitude which exceeds the relatively small absolute values of the second higher limit reference voltage VH2 and the second lower limit reference voltage VL2, the range control signal rc is set at the logic low level. When it is less than the relatively small absolute values of the reference voltage VH2 and VL2, the range control signal rc is set at the logic high level. Therefore, to the resistance ladder circuit 121", the high reference voltages having relatively large absolute values or the low reference voltage having relatively small absolute values are supplied. Therefore, the A/D conversion circuit 10" has the dynamic range of a high or a low level. Accordingly, the A/D conversion circuit 10" enables the dynamic range to be set arbitrarily and realizes high sensitivity and low cost, by supplying the input reference voltage from both sides of the resistance ladder circuit 121" which forms the reference potentials, and changing the voltage value of the input reference voltage gradually according to the level of the input analog signal Vin.

However, when the adaptive A/D converting device 10" has the expanded dynamic range, the adaptive A/D converting device 10" has a coarse resolution of quantization or the output digital signal D"out has a larger quantizing error. This is because the pair of the higher and the lower limit reference voltages having the relatively large absolute values are supplied to the both sides of the resistance ladder circuit 121" and the first through the n-th voltage comparison circuits VC1 to VCn are therefore supplied with the first through the n-th reference potentials V1 to Vn which have a wider potential interval. In addition, the output digital signal D"out merely indicates an input relative, virtual, or logical numerical value which represents an input relative, virtual, or logical level of the input analog signal Vin. As a result, the reception side must carry out, in response to the additional digital output signal DC, a complicated modification, translation, or conversion operation for modifying, translating, or converting the input relative, the virtual, or the logical numerical value into an input absolute, real, or physical numerical value which represents an input absolute, real, or physical level of the input analog signal Vin if necessary. Furthermore, the input relative, the virtual, or the logical numerical value obtained as a result of calculation has a lower precision when the dynamic range of the A/D converting device is expanded.

Figure 4:
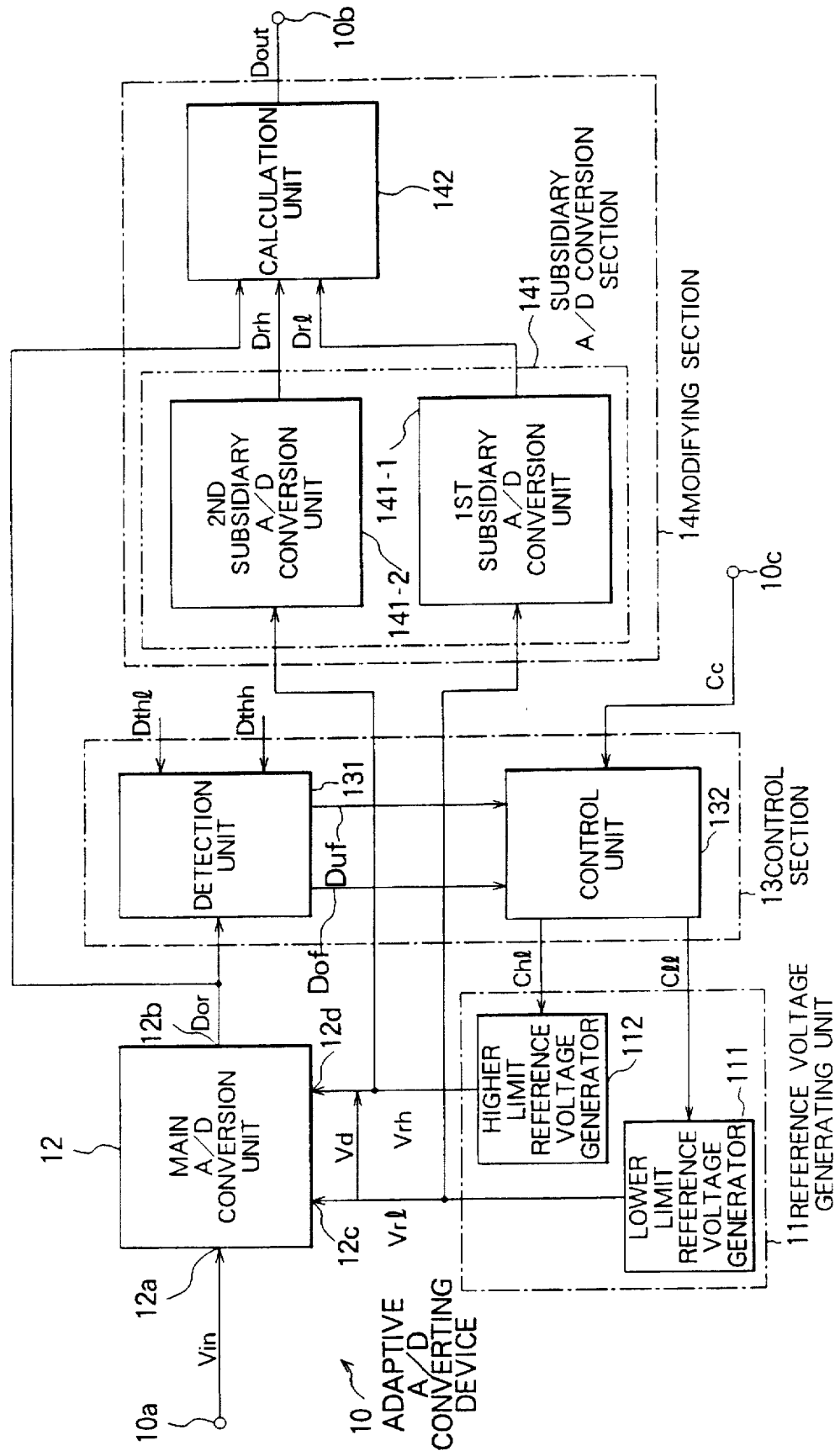
FIG. 4 is a block diagram of an adaptive A/D converting device according to a first embodiment of this invention.

Referring to FIG. 4, the description will proceed to an adaptive A/D converting device 10 according to a first embodiment of this invention. The illustrated adaptive A/D converting device 10 adaptively converts an input analog signal Vin indicative of an input analog voltage into an output digital signal Dout indicative of an output numerical value which corresponds to the input analog voltage. The adaptive A/D converting device 10 has a device input terminal 10a supplied with the input analog signal Vin, a device output terminal 10b for outputting the output digital signal Dout, and a control input terminal 10c supplied from an external device (not shown) such as a central processing unit (CPU), a digital signal processor (DSP), or other sequential circuits with a control command Cc indicative of one of a control enable indication and a control disable indication at a time.

The adaptive A/D converting device 10 comprises a reference voltage generating unit 11, a main A/D conversion unit 12, a control section 13, and a modifying section 14.

The reference voltage generating unit 11 generates a controllable reference voltage in response to a control signal which is supplied from the control section 13. More specifically, the reference voltage generating unit 11 generates, as the controllable reference voltage, a pair of lower and higher limit reference voltages Vrl and Vrh with a predetermined difference voltage Vd kept therebetween. In the example being illustrated, the reference voltage generating unit 11 comprises a lower limit reference voltage generator 111 for generating the lower limit reference voltage Vrl as a part of the controllable reference voltage and a higher limit reference voltage generator 112 for generating the higher limit reference voltage as another part of the controllable reference voltage. The lower limit reference voltage Vrl is always lower than the higher limit reference voltage Vrh by the predetermined difference voltage Vd. The controllable reference voltage is called as a controllable base voltage. The reference voltage generating unit 11 is therefore referred to as a base voltage generating unit for generating the controllable base voltage in response to the control signal. The controllable reference voltage is also called as a controllable bias voltage. The reference voltage generating unit 11 is also therefore referred to as a bias voltage generating unit for generating a controllable bias voltage.

The main A/D conversion unit 12 has a signal input terminal 12a supplied with the input analog signal Vin, a signal output terminal 12b for producing an original digital signal Dor, and lower and higher limit reference voltage input terminals 12c and 12d which are supplied with the lower and the higher limit reference voltages Vrl and Vrh, respectively. The main A/D conversion unit 12 converts, on the basis of the controllable reference voltage, the input analog signal into the original digital signal Dor. The original digital signal Dor indicates an input relative numerical value which represents an input relative level deviated from an input reference level of the input analog signal Vin. The input relative numerical value is called as an input displacement. The input relative numerical value is also called as an input virtual numerical value or an input logical numerical value. The original digital signal Dor is therefore referred to as a virtual digital signal indicative of the input virtual numerical value or a logical digital signal indicative of the input logical numerical value. In the manner which will later become clear, the lower and the higher limit reference voltages Vrl and Vrh are controlled so that the input analog voltage of the input analog signal Vin always lies in an observation allowable range defined between the lower and the higher limit reference voltages Vrl and Vrh when the control command Cc indicates the control enable indication. The observation allowable range has the predetermined difference voltage Vd and is called as an observation window having a constant width of the predetermined difference voltage Vd. As a result, the main A/D conversion unit 12 allows observation of the input relative, virtual, or logical level of the input analog signal Vin via the observation window.

In the manner known in the art, the main A/D converting unit 12 produces the original digital signal Dor represented by a k-digit binary number or k bits where k is a positive integer. When the positive integer k is equal to two, the original digital signal Dor has $2^2$ or four output states, namely, 00, 01, 10, and 11. In this event, the original digital signal Dor has a quantizing error of Vd/4. When the positive integer k is equal to three, the original digital signal Dor has $2^3$ or eight output states, namely, 000, 001, 010, 011, 100, 101, 110, and 111. In this event, the original digital signal Dor has the quantizing error of Vd/8. In general, when the original digital signal Dor has M output states, the original digital signal Dor has the quantizing error of Vd/M, where M is equal to $2^k$. Inasmuch as the positive integer k is a constant, the original digital signal Dor has a constant quantizing error of Vd/M. The original digital signal Dor is supplied to the control section 13 and the modifying section 14.

The control section 13 is connected to the main A/D conversion unit 12 and the reference voltage generating unit 11. The control section 13 controls, on the basis of the original digital signal Dor, the controllable reference voltage by supplying the control signal to the reference voltage generating unit 11. More specifically, the control section 13 comprises a detection unit 131 and a control unit 132. The detection unit 131 is connected to the main A/D converting unit 12 and has lower and higher predetermined threshold numerical values Dthl and Dthh which define lower and higher relative threshold levels Vthl and Vthh, respectively. The lower relative threshold level Vthl is, for example, set in an eighth of the constant width of the observation window (or the predetermined difference voltage Vd), namely, Vd/8 while the higher relative threshold level Vthh is, for example, set in seven-eighths of the constant width of the observation window (or the predetermined difference voltage Vd), namely, 7Vd/8.

The detection unit 131 comprises first and second comparing circuits (not shown). The first comparing circuit compares the input relative numerical value with the lower predetermined threshold numerical value Dthl while the second comparing circuit compares the input relative numerical value with the higher predetermined threshold numerical value Dthh. When the input relative numerical value exceeds the higher predetermined threshold numerical value Dthh, the second comparing circuit of the detection unit 131 produces an overflow detection signal Dof. When the input relative numerical value becomes smaller than the lower predetermined threshold numerical value Dthl, the first comparing circuit of the detection unit 131 produces an underflow detection signal Duf. One of the overflow detection signal Dof and the underflow detection signal Duf is supplied to the control unit 132 at a time. Each of the first and the second comparing circuits may be a magnitude comparator implemented by a CMOS integrated circuit having a trade name of μPD74HC85.

The control unit 132 is connected to the detection unit 131 and the reference voltage generating unit 11. The control unit 132 produces, as the control signal, a pair of lower and higher limit control signals Cll and Chl. The lower limit control signal Cll is supplied to the lower limit reference voltage generator 111 while the higher limit control signal Chl is supplied to the higher limit reference voltage generator 112. When the control command Cc indicates the control enable indication, the control unit 132 controls, in response to the overflow detection signal Dof, the reference voltage generating unit 11 so as to increase the lower and the higher limit reference voltages Vrl and Vrh. When the control command Cc indicates the control enable indication, the control unit 132 controls, in response to the underflow detection signal Duf, the reference voltage generating unit 11 so as to decrease the lower and the higher limit reference voltages Vrl and Vrh. As a result, the input analog voltage of the input analog signal Vin always lies in an observation allowable range defined between the lower and the higher limit reference voltages Vrl and Vrh.

When the control command Cc indicates the control disable indication, the control unit 132 is put into a control disable condition to make the reference voltage generating unit 11 generate lower and higher predetermined initial limit reference voltages as the lower and the higher limit reference voltages Vrl and Vrh, respectively. Under the circumstances, the observation allowable range is restricted to a fixed observation range defined between the lower and the higher predetermined initial limit reference voltages.

The modifying section 14 is connected to the main A/D conversion unit 12 and the reference voltage generating unit 11. The modifying section 14 modifies, on the basis of the controllable reference voltage, the original digital signal Dor into a modified signal indicative of the input absolute numerical value which represents an absolute level of the input analog signal Vin. The modifying section 14 produces the modified digital signal as the output digital signal. As a result, the adaptive A/D converting device 10 always produces the output digital signal Dout having the constant quantizing error Vd/M although the input analog signal has an amplitude which changes drastically and therefore apparently expands a dynamic range of the A/D converting device.

As described above, the absolute level of the input analog signal Vin is called as the real level or the physical level. In addition, the input absolute numerical value is referred to as the input real numerical value representative of the real level or the input physical numerical value representative of the physical level. Accordingly, the modifying section 14 is called as a translating section for translating, on the basis of the controllable base voltage, the virtual signal into a real digital signal indicative of the input real numerical value or as a converting section for converting, on the basis of the controllable bias voltage, the logical digital signal into a physical digital signal indicative of the input physical numerical value.

More specifically, the modifying section 14 comprises a subsidiary A/D conversion section 141 and a calculation unit 142. The subsidiary A/D conversion section 141 is connected to the reference voltage generating unit 11. The subsidiary A/D conversion section 141 converts the controllable reference voltage into a reference digital signal indicative of a reference numerical value which represents the input reference level of the input analog signal Vin. Connected to the main A/D conversion unit 12 and the subsidiary A/D conversion section 141, the calculation unit 142 calculates the input absolute, real, or physical numerical value of the input analog signal using the relative, virtual, or logical numerical value on the basis of the reference numerical value to produce a calculated digital signal indicative of the input absolute, real, or physical numerical value as the output digital signal Dout.

In the example being illustrated, the subsidiary A/D conversion section 141 comprises first and second subsidiary A/D conversion units 141-1 and 141-2. The first subsidiary A/D conversion unit 141-1 is connected to the lower limit reference voltage generator 111 while the second subsidiary A/D conversion unit 141-2 is connected to the higher limit reference voltage generator 112. The first subsidiary A/D conversion unit 141-1 converts the lower limit reference voltage Vrl into a lower limit reference digital signal Drl as a part of the reference digital signal while the second subsidiary A/D conversion unit 141-2 converts the higher limit reference voltage Vrh into a higher limit reference digital signal Drh as another part of the reference digital signal. The lower limit reference digital signal Drl and the higher limit reference digital signal Drh are supplied to the calculation unit 142.

In this event, the calculation unit 142 calculates the input absolute, real, or physical numerical value Dout of the input analog signal Vin in accordance with the following equation:

$$Dout=\{(Drh-Drl)\times Dor\}/M+Drl \qquad (1)$$

It will be assumed that each of the lower limit reference digital signal Drl and the higher limit reference digital signal Drh has a least significant bit (LSB) which corresponds to a constant width of reference voltage change step that is represented by a reference step voltage of Vref. In this event, the input analog voltage Vin of the input analog signal is nearly equal to Dout times of the reference step voltage Vref, namely:

$$Vin \approx Dout \times Vref$$
$$= [\{(Drh-Drl) \times Dor\}/M + Drl] \times Vref$$

As a result, it is possible, in a reception side for receiving the output digital signal Dout, to easily calculate an approximate value of the input analog voltage Vin. It is noted that the predetermined difference voltage Vd is equal to (Drh–Drl) times of the reference step voltage Vref, namely:

$$Vd=(Drh-Drl)\times Vref$$

Accordingly, the output digital signal Dout has the constant quantizing error or a constant width of quantization step of $\{(Drh-Drl)\times Vref\}/M$ or Vd/M. In other words, the output digital signal Dout always has a constant precision although the dynamic range of the adaptive A/D converting device 10 is expanded.

Figure 5:
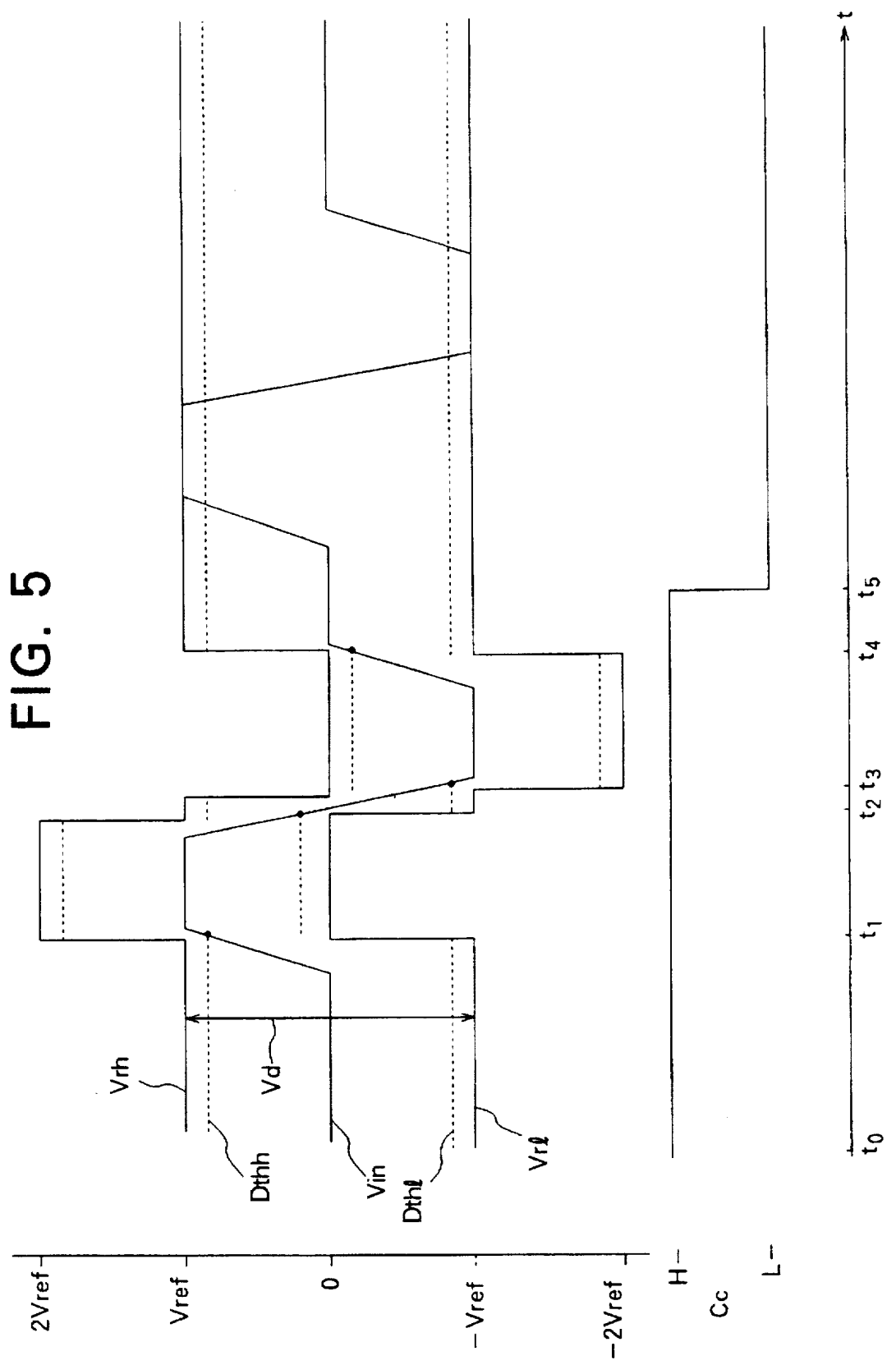
FIG. 5 shows a time chart for use in describing operation of the adaptive A/D converting device illustrated in FIG. 4.

Referring now to FIG. 5 in addition to FIG. 4, an operation of the adaptive A/D converting device 10 of FIG. 4 will be described below. It will be assumed that the control enable indication of the control command Cc has a logic high (H) level while the control disable indication of the control command Cc has a logic low (L) level. In addition, it will be presumed that the lower and the higher limit reference voltage generators 111 and 112 in the reference voltage generating unit 11 generates, as the lower and the higher limit reference voltages Vrl and Vrh, the lower and the higher predetermined initial limit reference voltages –Vref and Vref, respectively, at an initial time instant $t_0$. Under the circumstances, the predetermined difference voltage Vd is equal to twice of the reference step voltage Vref, namely:

$$Vd=2Vref$$

It will be furthermore assumed that the control command Cc indicates the control enable indication of the logic high level at the initial time instant $t_0$ as shown in FIG. 5.

The main A/D conversion unit 12 converts the input analog signal Vin into the original digital signal Dor via the observation window or the observation allowable range which is defined between the lower and the higher limit reference voltages Vrl and Vrh. When the detection unit 131 detects that the original digital signal Dor has the input relative numerical value which exceeds the higher predetermined threshold numerical value Dthh at a first time instant $t_1$, the detection unit 131 produces the overflow detection signal Dof. Responsive to the overflow detection signal Dof, the control unit 132 controls the lower and the higher limit reference voltage generators 111 and 112 so as to increase the lower and the higher limit reference voltages Vrl and Vrh. As a result, the lower and the higher limit reference voltage generators 111 and 112 generates, as the lower and the higher limit reference voltages Vrl and Vrh, refreshed reference voltages of 0 and 2Vref, respectively.

When the detection unit 131 detects that the original digital signal Dor has the input relative numerical value which becomes smaller than the lower predetermined threshold numerical value Dthl at a second time instant $t_2$, the detection unit 131 produces the underflow detection signal Duf. Responsive to the underflow detection signal Duf, the control unit 132 controls the lower and the higher limit reference voltage generators 111 and 112 so as to decrease the lower and the higher limit reference voltages Vrl and Vrh. As a result, the lower and the higher limit reference voltage generators 111 and 112 generates, as the lower and the higher limit reference voltages Vrl and Vrh, refreshed reference voltages of –Vref and Vref, respectively.

When the detection unit 131 detects that the original digital signal Dor has the input relative numerical value which becomes smaller than the lower predetermined threshold numerical value Dthl at a third time instant $t_3$, the detection unit 131 produces the underflow detection signal Duf. Responsive to the underflow detection signal Duf, the control unit 132 controls the lower and the higher limit reference voltage generators 111 and 112 so as to decrease the lower and the higher limit reference voltages Vrl and Vrh. As a result, the lower and the higher limit reference voltage generators 111 and 112 generate, as the lower and the higher limit reference voltages Vrl and Vrh, refreshed reference voltages of –2Vref and 0, respectively.

When the detection unit 131 detects that the original digital signal Dor has the input relative numerical value which exceeds the higher predetermined threshold numerical value Dthh at a fourth time instant $t_4$, the detection unit 131 produces the overflow detection signal Dof. Responsive to the overflow detection signal Dof, the control unit 132 controls the lower and the higher limit reference voltage generators 111 and 112 so as to increase the lower and the higher limit reference voltages Vrl and Vrh. As a result, the lower and the higher limit reference voltage generators 111 and 112 generates, as the lower and the higher limit reference voltages Vrl and Vrh, refreshed reference voltages of –Vref and Vref, respectively.

The control command Cc indicates the control disable indication of the logic low level at a fifth time instant $t_5$ as shown in FIG. 5. Response to the control command Cc indicative of the control disable indication, the control unit 132 is put into the control disable condition to make the reference voltage generating unit 11 generate, as the lower and the higher limit reference voltages Vrl and Vrh, the lower and the higher predetermined initial limit reference voltages –Vref and Vref, respectively. As a result, the observation allowable range of the main A/D conversion unit 12 is restricted to the fixed observation range defined between the lower and the higher predetermined initial limit reference voltages −Vref and Vref. Accordingly, the reference voltage generating unit 11 generates the lower and the higher predetermined initial limit reference voltages −Vref and Vref as the lower and the higher limit reference voltages Vrl and Vrh, respectively, although either the overflow detection signal Dof or the underflow detection signal Duf is supplied to the control unit 132 from the detection unit 131.

Figure 6:
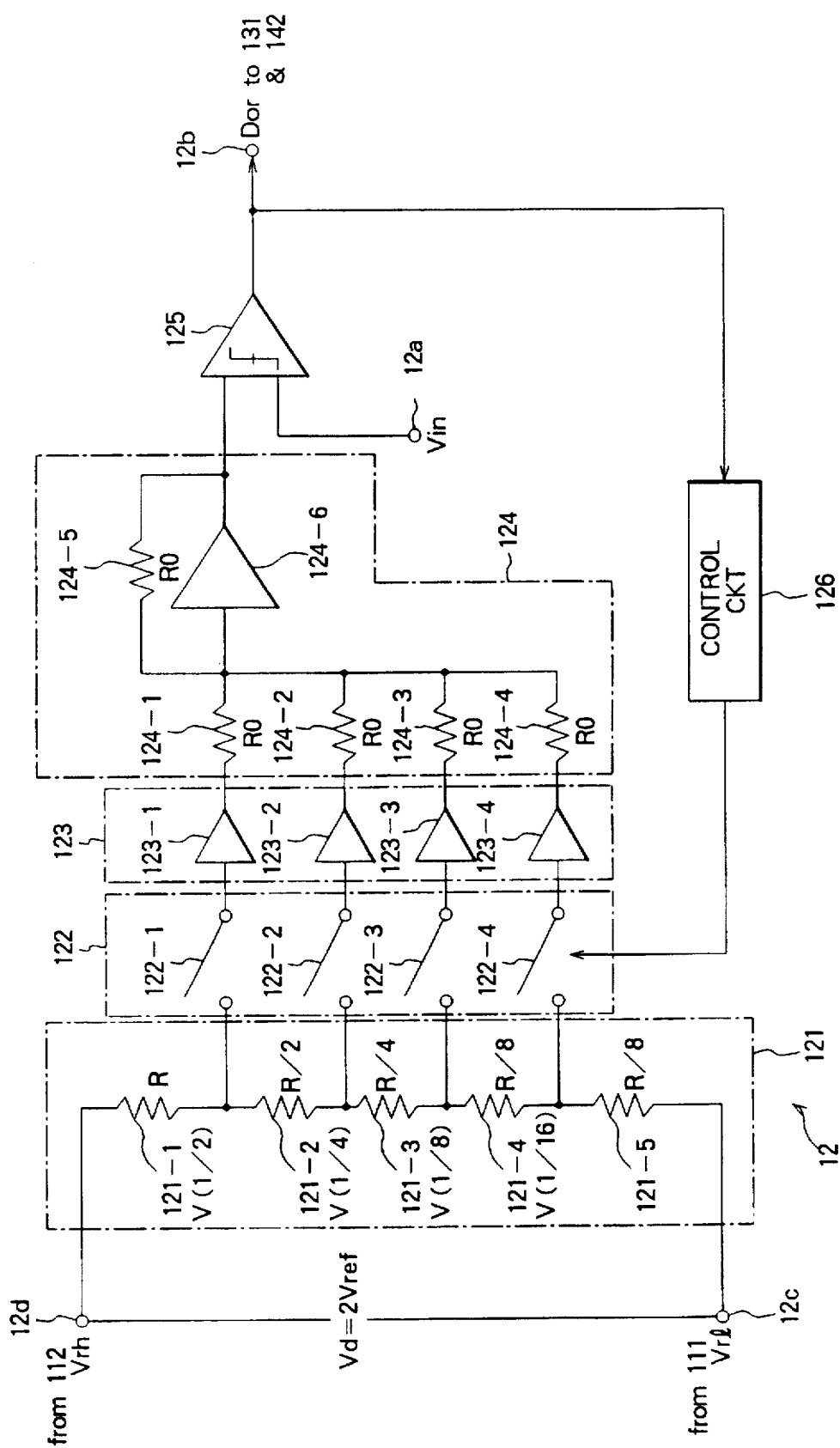
FIG. 6 is a block diagram of a main A/D conversion unit for use in the adaptive A/D converting device illustrated in FIG. 4.

Turning to FIG. 6, the description will proceed to the main A/D conversion unit 12. The illustrated main A/D conversion unit 12 is a successive approximation type four-bit A/D converter for producing the original digital signal Dor which consists of four bits arranged from a most significant bit (MSB) or $2^3$ to the least significant bit (LSB) or $2^0$. Such a successive approximation type four-bit A/D converter may be used as the first or the second subsidiary A/D conversion units 141-1 or 141-2 although an input signal and a reference voltage are different from those in the main A/D conversion unit 12.

The main A/D conversion unit 12 comprises a resistance ladder circuit 121, a switching circuit 122, a buffer circuit 123, an addition circuit 124, a comparator 125, and a control circuit 126.

The resistance ladder circuit 121 comprises first through fifth resistors 121-1, 121-2, 121-3, 121-4, and 121-5 which are connected in series to one another. The first resistor 121-1 has an end connected to the higher limit reference voltage input terminal 12d while the fifth resistor 121-5 has an end connected to the lower limit reference voltage input terminal 12c. It is provided that the first through the fifth resistors 121-1 to 121-5 has first through fifth resistance values of R, R/2, R/4, R/8, and R/8, respectively. The resistance ladder circuit 121 forms first through fourth relative reference potentials V(1/2), V(1/4), V(1/8), and V(1/16) out of a first node between the first and the second resistors 121-1 and 121-2, a second node between the second and the third resistors 121-2 and 121-3, a third node between the third and the fourth resistors 121-3 and 121-4, and a fourth node between the fourth and the fifth resistors 121-4 and 121-5, respectively. The first through the fourth relative reference potentials V(1/2) to V(1/16) are represented using the predetermined difference voltage Vd or 2Vref as follows:

$$V(1/2)=Vd/2=Vref,$$

$$V(1/4)=Vd/4=Vref/2,$$

$$V(1/8)=Vd/8=Vref/4,$$

and $$V(1/16)=Vd/16=Vref/8.$$

The first through the fourth relative reference potentials V(1/2) to V(1/16) are supplied to the switching circuit 122. The switching circuit 122 comprises first through fourth switches 122-1, 122-2, 122-3, and 122-4. The switching circuit 122 is controlled by the control circuit 126 in the manner which will later be described. The first through the fourth switches 122-1 to 122-4 have first through fourth input terminals supplied with the first through the fourth relative reference potentials V(1/2) to V(1/16), respectively, and have first through fourth output terminals, respectively. The first through the fourth output terminals of the first through the fourth switches 122-1 to 122-4 are connected to the buffer circuit 123. The buffer circuit 123 comprises first through fourth buffer amplifiers 123-1, 123-2, 123-3, and 123-4 which are connected to the first through the fourth output terminals of the first through the fourth switches 122-1 to 122-4, respectively. Each of the first through the fourth buffer amplifiers 123-1 to 123-4 has a gain of one and transmits an input to an output as it is. The buffer circuit 123 is connected to the addition circuit 124.

The addition circuit 124 comprises first through fourth resistors 124-1, 124-2, 124-3, and 124-4, a feedback resistor 124-5, and an amplifier 124-6. The first through the fourth input resistors 124-1 to 124-4 have input ends which are connected to the first through the fourth buffer amplifiers 123-1 to 123-4, respectively, and have output ends which are connected to an input terminal of the amplifier 124-6. The feedback resistor 124-5 is connected between the input and the output terminals of the amplifier 124-6. Each of first through the fourth input resistors 124-1 to 124-4 and the feedback resistor 124-5 has a resistance value of R0. The addition circuit 124 adds input voltages through the first through the fourth input resistors 124-1 to 124-4 to produce an added signal indicative of an added voltage from the output terminal thereof. The output terminal of the amplifier 124-6 is connected to an input terminal of the comparator 125.

The comparator 125 has another input terminal connected to the signal input terminal 12a which is supplied with the input analog signal Vin. The comparator 125 compares the input analog voltage of the input analog signal Vin with the added voltage of the added signal. The comparator 125 produces a comparison result signal indicative of a result of comparison from an output terminal thereof. When the input analog voltage is not lower than the added voltage, the comparator 125 produces, as the comparison result signal, a signal of logic "1" level. Otherwise, the comparator 125 produces, as the comparison result signal, a signal of logic "0" level. The output terminal of the comparator 125 is connected to the signal output terminal 12b and the control circuit 126. Responsive to the comparison result signal, the control circuit 126 controls turning on/off of the first through the fourth switches 122-1 to 122-4 in the switching circuit 122 in the manner which will later become clear.

The description will proceed to an operation of the main A/D conversion unit 12 illustrated in FIG. 6. In an initial condition, all of the first through the fourth switches 122-1 to 122-4 turn on. It will be assumed that the input analog signal Vin has the input relative level which is not lower than 13Vd/16 and is lower than 7Vd/8. In other words, the input analog signal Vin has the input absolute level represented by the following equation:

$$(Vrl+13Vd/16) \leq Vin < (Vrl+7Vd/8)$$

When the input analog signal Vin is supplied to the signal input terminal 12a, the control circuit 126 turns the first switch 122-1 on with the second through the fourth switches 122-2, 122-3, and 122-4 turned off. In this event, the first relative reference potential V(1/2) or Vd/2 is supplied to the addition circuit 124 via the first switch 122-1 and the first buffer amplifier .123-1. As a result, the addition circuit 124 produces the added signal indicative of the added voltage equal to the lower limit reference voltage Vrl plus the first relative reference potential Vd/2, namely, (Vrl+Vd/2). The comparator 125 compares the input analog signal Vin with the added signal. Inasmuch as the input analog voltage of the input analog signal Vin is not lower than the added voltage (Vrl+Vd/2), the comparator 125 produces the comparison result signal indicative of the logic "1" level. The comparison result signal indicative of the logic "1" level is produced from the signal output terminal 12b as the MSB or the $2^3$ bit of the original digital signal Dor.

At the same time, the comparison result signal indicative of the logic "1" level is supplied to the control circuit 126. Responsive to the comparison result signal indicative of the logic "1" level, the control circuit 126 turns the second switch 122-2 on with the first switch 122-1 turned on. As a result, the first and the second relative reference potentials V(1/2) or Vd/2 and V(1/4) or Vd/4 are supplied to the addition circuit 124 via the first and the second switches 122-1 and 122-2, and the first and the second buffer amplifiers 123-1 and 123-2. As a result, the addition circuit 124 produces the added signal indicative of the added voltage equal to the lower limit reference voltage Vrl plus a combined relative reference potential 3Vd/4, namely, (Vrl+3Vd/4). The comparator 125 compares the input analog signal Vin with the added signal. Inasmuch as the input analog voltage of the input analog signal Vin is not lower than the added voltage (Vrl+3Vd/4), the comparator 125 produces the comparison result signal indicative of the logic "1" level. The comparison result signal indicative of the logic "1" level is produced from the signal output terminal 12b as the $2^2$ bit of the original digital signal Dor.

At the same time, the comparison result signal indicative of the logic "1" level is supplied to the control circuit 126. Responsive to the comparison result signal indicative of the logic "1" level, the control circuit 126 turns the third switch 122-3 on with the first and the second switches 122-1 and 122-2 turned on. As a result, the first through the third relative reference potentials V(1/2) or Vd/2, V(1/4) or Vd/4, and V(1/8) or Vd/8 are supplied to the addition circuit 124 via the first through the third switches 122-1 to 122-3, and the first through the third buffer amplifiers 123-1 to 123-3. As a result, the addition circuit 124 produces the added signal indicative of the added voltage equal to the lower limit reference voltage Vrl plus a combined relative reference potential 7Vd/8, namely, (Vrl+7Vd/8). The comparator 125 compares the input analog signal Vin with the added signal. Inasmuch as the input analog voltage of the input analog signal Vin is lower than the added voltage (Vrl+7Vd/8), the comparator 125 produces the comparison result signal indicative of the logic "0" level. The comparison result signal indicative of the logic "0" level is produced from the signal output terminal 12b as the $2^1$ bit of the original digital signal Dor.

At the same time, the comparison result signal indicative of the logic "0" level is supplied to the control circuit 126. Responsive to the comparison result signal indicative of the logic "0" level, the control circuit 126 turns the fourth switch 122-4 on with the first and the second switches 122-1 and 122-2 turned on but with the third switch 122-3 turned off. As a result, the first, the second, and the fourth relative reference potentials V(1/2) or, Vd/2, V(1/4) or Vd/4, and V(1/16) or Vd/16 are supplied to the addition circuit 124 via the first, the second, and the fourth switches 122-1, 122-2, and 122-4, and the first, the second, and the fourth buffer amplifiers 123-1, 123-2, and 123-4. As a result, the addition circuit 124 produces the added signal indicative of the added voltage equal to the lower limit reference voltage Vrl plus a combined relative reference potential 13Vd/16, namely, (Vrl+13Vd/16). The comparator 125 compares the input analog signal Vin with the added signal. Inasmuch as the input analog voltage of the input analog signal Vin is not lower than the added voltage (Vrl+13Vd/16), the comparator 125 produces the comparison result signal indicative of the logic "1" level. The comparison result signal indicative of the logic "1" level is produced from the signal output terminal 12b as the LSB or the $2^0$ bit of the original digital signal Dor. The original digital signal Dor consists of four bits of 1101.

As described above, the main A/D conversion unit 12 produces the original digital signal Dor from the MSB to the LSB in descending order serially.

Figure 7:
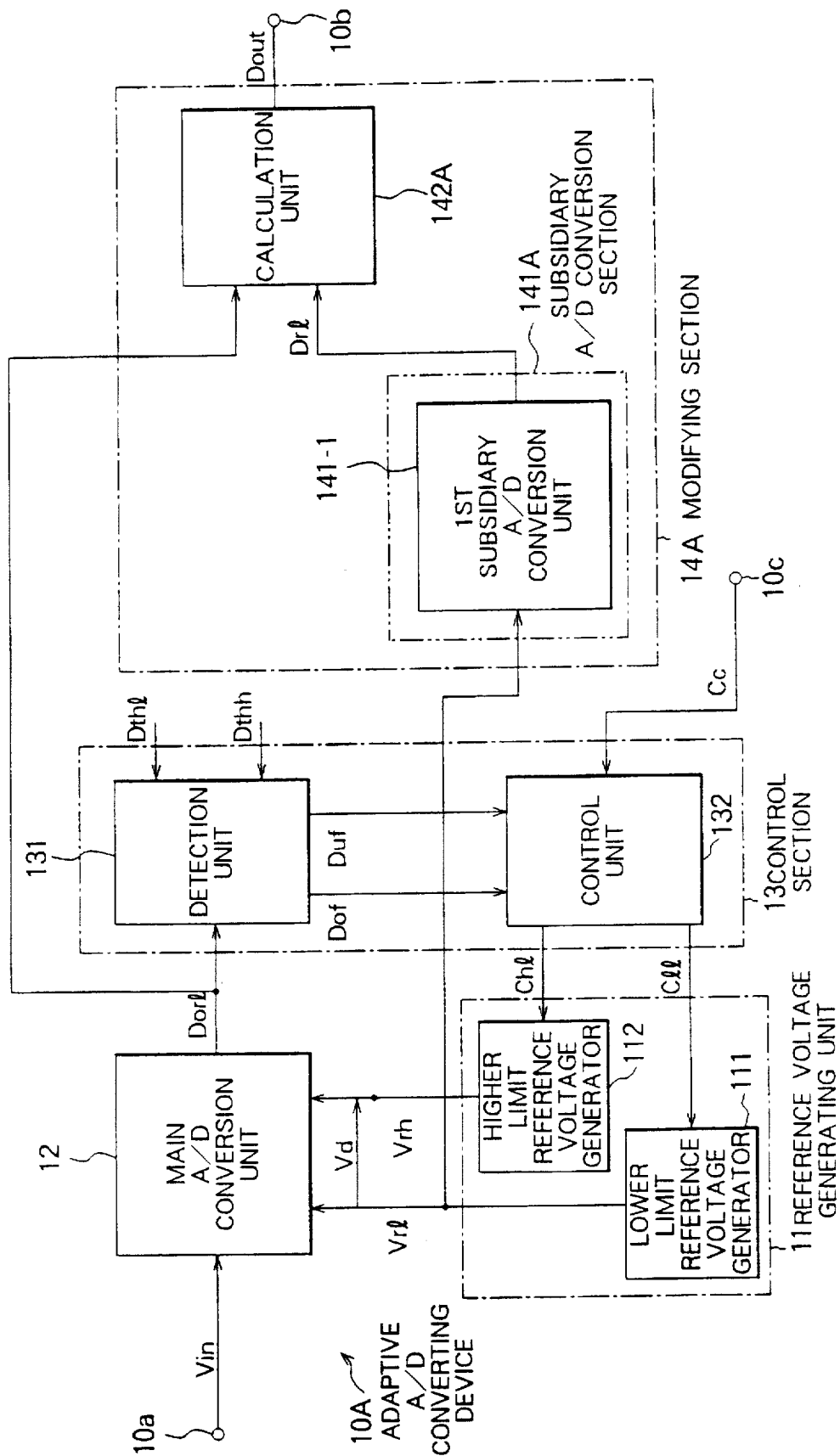
FIG. 7 is a block diagram of an adaptive A/D converting device according to a second embodiment of this invention.

Referring to FIG. 7, an adaptive A/D converting device 10A according to a second embodiment of this invention is similar in structure to that illustrated in FIG. 4 except that the modifying section is modified to be different from that described in conjunction with FIG. 4 as will later become clear. The modifying section is therefore depicted at 14A.

The modifying section 14A is connected to the main A/D conversion unit 12 and the lower limit reference voltage generator 111. The modifying section 14A modifies, on the basis of the lower limit reference voltage Vrl, the original digital signal Dor into the modified signal indicative of the input absolute numerical value which represents the absolute level of the input analog signal Vin. The modifying section 14A produces the modified digital signal as the output digital signal.

More specifically, the modifying section 14A comprises a subsidiary A/D conversion section 141A and a calculation unit 142A. The subsidiary A/D conversion section 141A is connected to the lower limit reference voltage generator 111. The subsidiary A/D conversion section 141A only comprises the first subsidiary A/D conversion unit 141-1 for converting the lower limit reference voltage Vrl into the lower limit reference digital signal Drl as the reference digital signal. The lower limit reference digital signal Drl is supplied to the calculation unit 142A. Connected to the main A/D conversion unit 12 and the subsidiary A/D conversion section 141A, the calculation unit 142A calculates the input absolute numerical value of the input analog signal Vin using the relative numerical value on the basis of the lower limit reference numerical value Drl to produce the calculated digital signal indicative of the input absolute numerical value as the output digital signal Dout.

In the example being illustrated, it is assumed that the predetermined difference voltage Vd is previously known. In this event, (Drh−Drl) in the above-mentioned equation (1) has a previously-known value. As a result, the calculation unit 142A calculates the input absolute numerical value of the input analog signal Vin without using the higher limit reference digital signal Drh.

Figure 8:
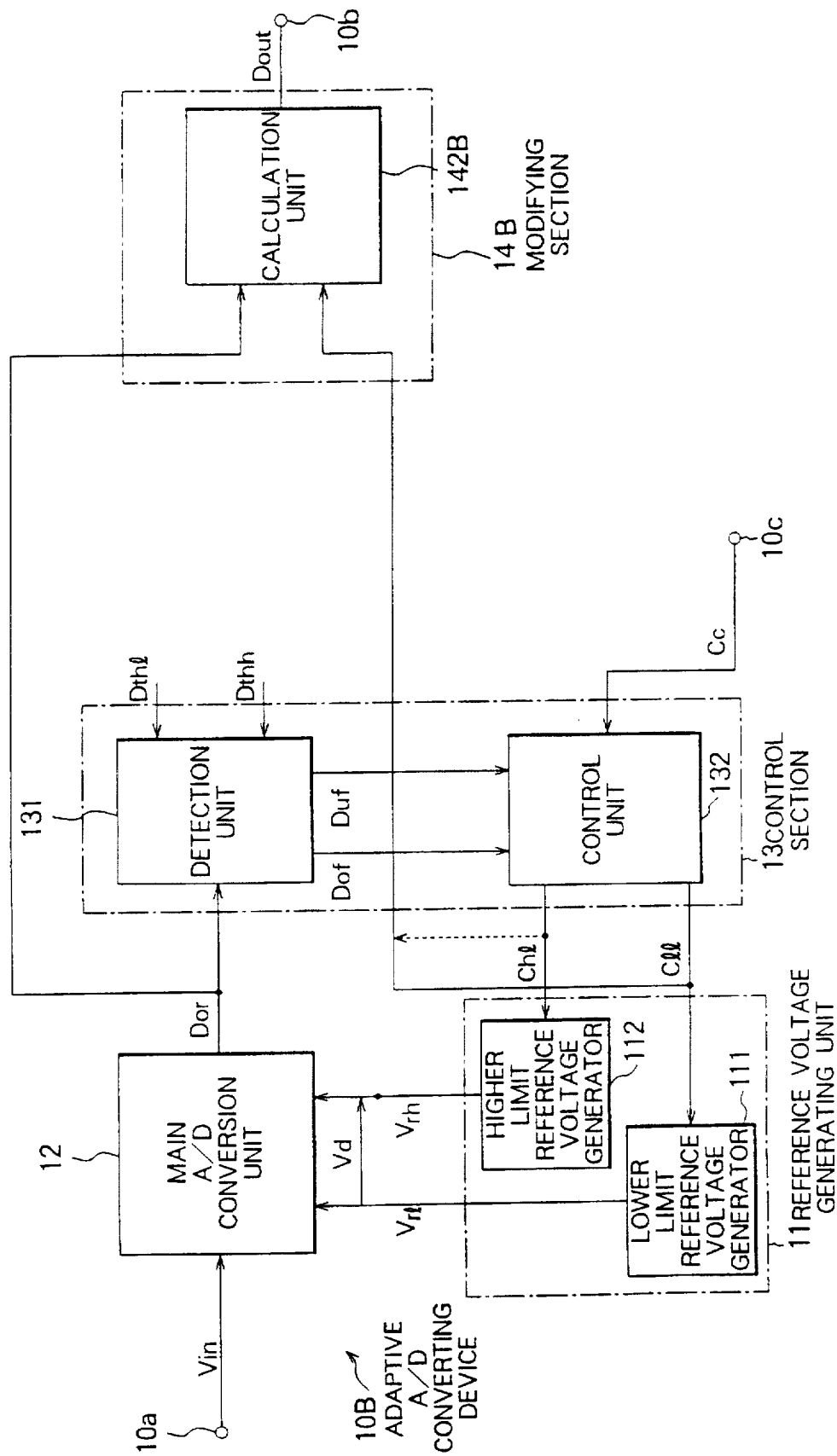
FIG. 8 is a block diagram of an adaptive A/D converting device according to a third embodiment of this invention.

Referring to FIG. 8, an adaptive A/D converting device 10B according to a third embodiment of this invention is similar in structure to that illustrated in FIG. 7 except that the modifying section is modified to be different from that described in conjunction with FIG. 7 as will later become clear. The modifying section is therefore depicted at 14B.

The modifying section 14B is connected to the main A/D conversion unit 12 and the control unit 132. The modifying unit 14B modifies, on the basis of the lower limit control signal Cll, the original digital signal Dor into the modified signal indicative of the input absolute numerical value which represents the absolute level of the input analog signal Vin. The modifying section 14B produces the modified digital signal as the output digital signal Dout.

More specifically, the modifying section 14B comprises a calculation unit 142B alone. Connected to the main A/D conversion unit 12 and the control unit 132, the calculation unit 142B calculates the input absolute numerical value of the input analog signal Vin using the relative numerical value on the basis of the lower limit control signal Cll to produce the calculated digital signal indicative of the input absolute numerical value as the output digital signal Dout.

In the example being illustrated, it is assumed that the predetermined difference voltage Vd is previously known. In this event, (Drh−Drl) in the above-mentioned equation (1)

has a previously-known value. In addition, the lower limit reference digital signal Drl is calculated on the basis of the lower limit control signal Cll. As a result, the calculation unit 142B calculates the input absolute numerical value of the input analog signal Vin without using both of the lower and the higher limit reference digital signals Drl and Drh.

The calculation unit 142B may be supplied with the higher limit control signal Chl in place of the lower limit control signal Cll as shown at a dotted line in FIG. 8.

Figure 9:
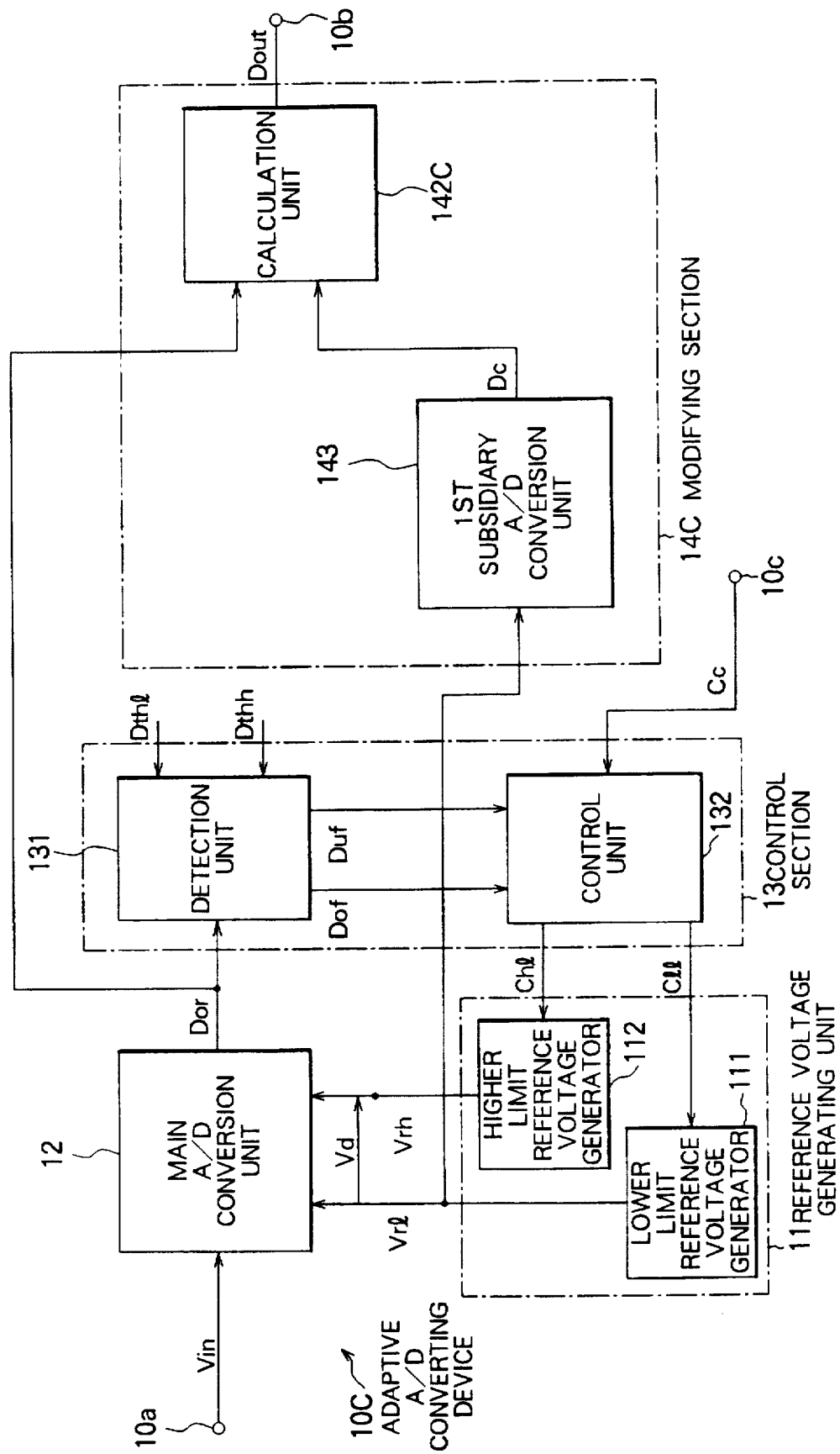
FIG. 9 is a block diagram of an adaptive A/D converting device according to a fourth embodiment of this invention.

Referring to FIG. 9, an adaptive A/D converting device 10C according to a fourth embodiment of this invention is similar in structure to that illustrated in FIG. 8 except that the modifying section is modified to be different from that described in conjunction with FIG. 8 as will later become clear. The modifying section is therefore depicted at 14C.

The modifying section 14C is connected to the main A/D conversion unit 12 and the detection unit 131. The modifying unit 14C modifies, on the basis of the underflow and the overflow detection signals Duf and Dof, the original digital signal Dor into the modified signal indicative of the input absolute numerical value which represents the absolute level of the input analog signal Vin. The modifying section 14B produces the modified digital signal as the output digital signal.

More specifically, the modifying section 14C comprises a calculation unit 142C and an up-down counter 143. The up-down counter 143 is connected to the detection unit 131 and the control input terminal 10c. When the control command Cc indicates the control disable indication, the up-down counter 143 is reset to put into a disable state to produce a counter output signal Dc indicative of a count of zero. When the control command Cc indicates the control enable indication, the up-down counter 143 is put into an enable condition to carry out an up-down counting operation. Responsive to the overflow detection signal Dof, the up-down counter 143 counts up the count to be incremented by one. Responsive to the underflow detection signal Duf, the up-down counter 143 counts down the count to be decremented by one. Connected to the main A/D conversion unit 12 and the up-down counter 143, the calculation unit 142C calculates the input absolute numerical value of the input analog signal Vin using the relative numerical value on the basis of the counter output signal Dc to produce the calculated digital signal indicative of the input absolute numerical value as the output digital signal Dout.

In the example being illustrated, it is assumed that the predetermined difference voltage Vd is previously known. In this event, (Drh−Drl) in the above-mentioned equation (1) has a previously-known value. In addition, the lower limit reference digital signal Drl is calculated on the basis of the counter signal Dc. As a result, the calculation unit 142C calculates the input absolute numerical value of the input analog signal Vin without using both of the lower and the higher limit reference digital signals Drl and Drh.

In the above-mentioned first through fourth embodiments, the input absolute numerical value of the input analog signal Vin is calculated in the adaptive A/D converting devices. However, the input absolute numerical value of the input analog signal Vin may be calculated by the reception side for receiving the output digital signal Dout in the manner which will later be described in conjunction with FIGS. 10 through 13.

Figure 10:
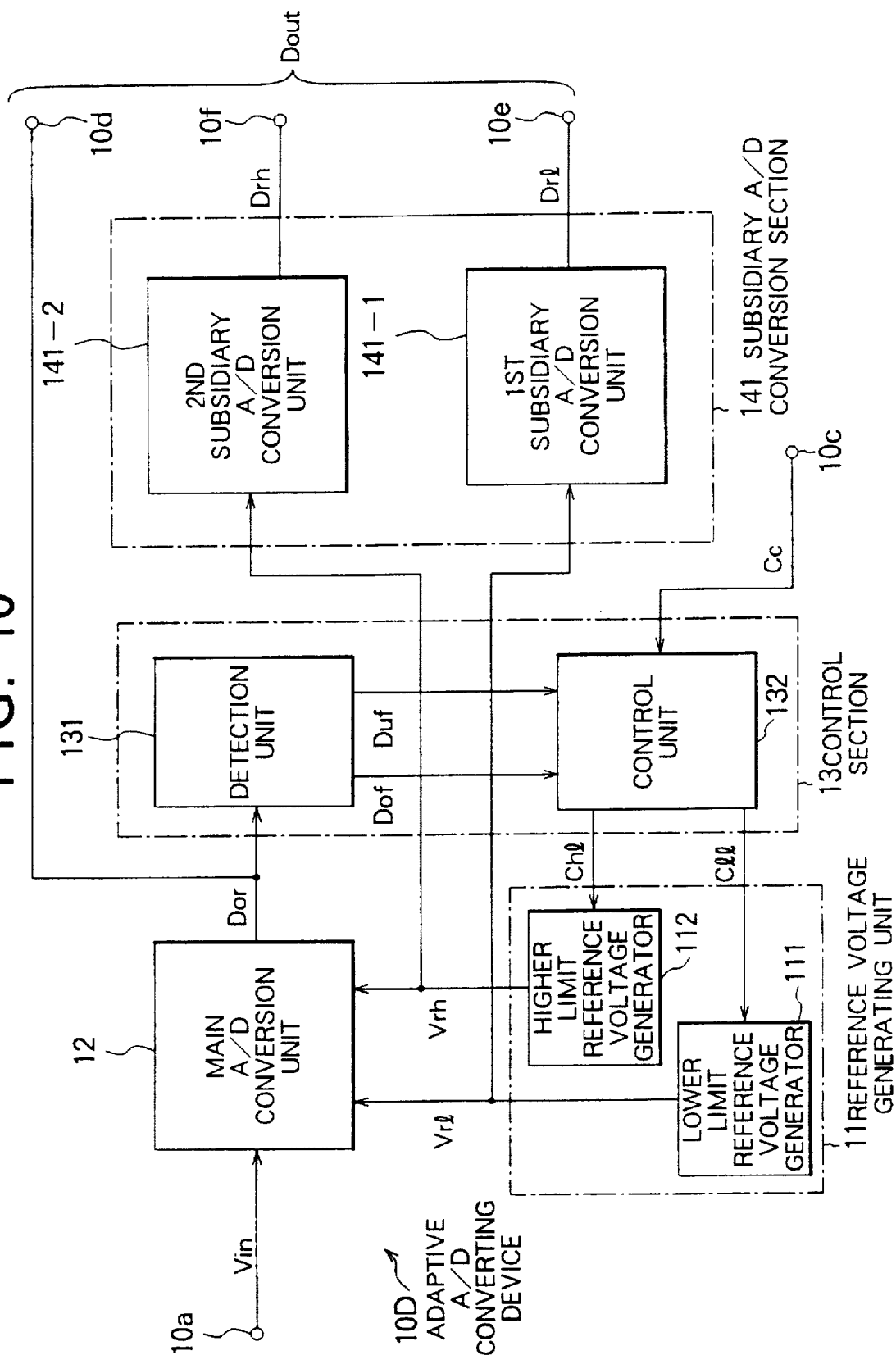
FIG. 10 is a block diagram of an adaptive A/D converting device according to a fifth embodiment of this invention.

Turning to FIG. 10, an adaptive A/D converting device 10D according to a fifth embodiment of this invention is similar in structure to that illustrated in FIG. 4 except that the calculation unit 142 is omitted from the adaptive A/D converting device 10. The adaptive A/D converting device 10D has first through third device output terminals 10d, 10e, and 10f. The first device output terminal 10d is for outputting the original digital signal Dor. Accordingly, the first device output terminal 10d is called as an original output terminal. The second device output terminal 10e is for outputting the lower limit reference digital signal Drl while the third device output terminal 10f is for outputting the higher limit reference digital signal Drh. In the example being illustrated, a pair of the lower and the higher limit reference digital signals Drl and Drh is called as the reference digital signal. That is, a combination of the second and the third device output terminals 10e and 10f serves as a reference output terminal for outputting the reference digital signal. The subsidiary A/D converting section 141 acts as a reference digital signal production arrangement for producing the reference digital signal. A combination of the first through the third device output terminals 10d, 10e, and 10f is operable as an output arrangement for outputting the original digital signal Dor and the reference digital signal collectively as the output digital signal Dout which is delivered to the reception side (not shown).

Figure 11:
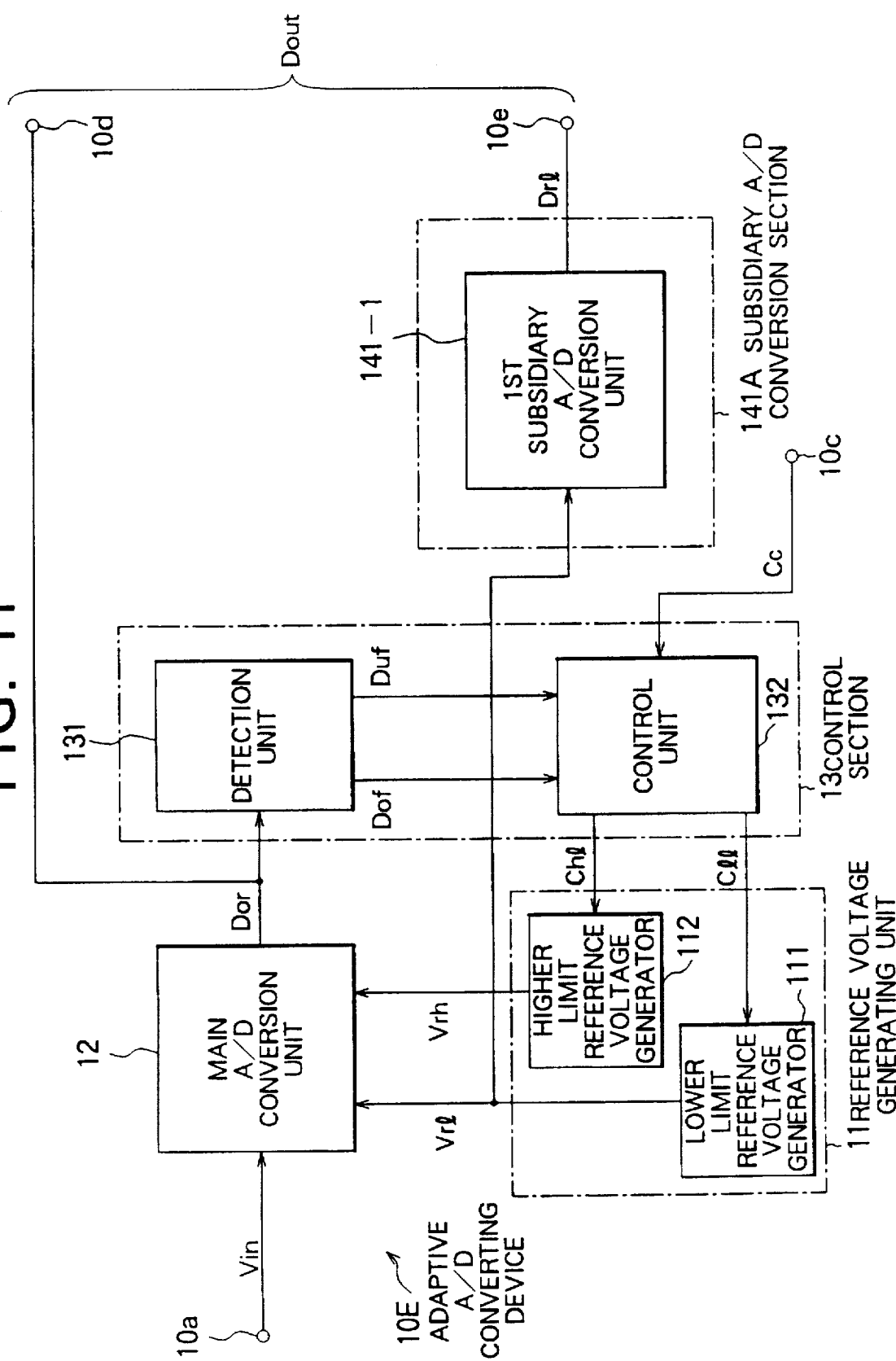
FIG. 11 is a block diagram of an adaptive A/D converting device according to a sixth embodiment of this invention.

Turning to FIG. 11, an adaptive A/D converting device 10E according to a sixth embodiment of this invention is similar in structure to that illustrated in FIG. 7 except that the calculation unit 142A is omitted from the adaptive A/D converting device 10A. The adaptive A/D converting device 10E has the first and the second device output terminals 10d and 10e. In the example being illustrated, the lower limit reference digital signal Drl is called as the reference digital signal. That is, the second device output terminal 10e serves as a reference output terminal for outputting the reference digital signal. The subsidiary A/D converting section 141A acts as a reference digital signal production arrangement for producing the reference digital signal. A combination of the first and the second device output terminals 10d and 10e serves as an output arrangement for outputting the original digital signal Dor and the reference digital signal collectively as the output digital signal Dout which is delivered to the reception side (not shown).

Figure 12:
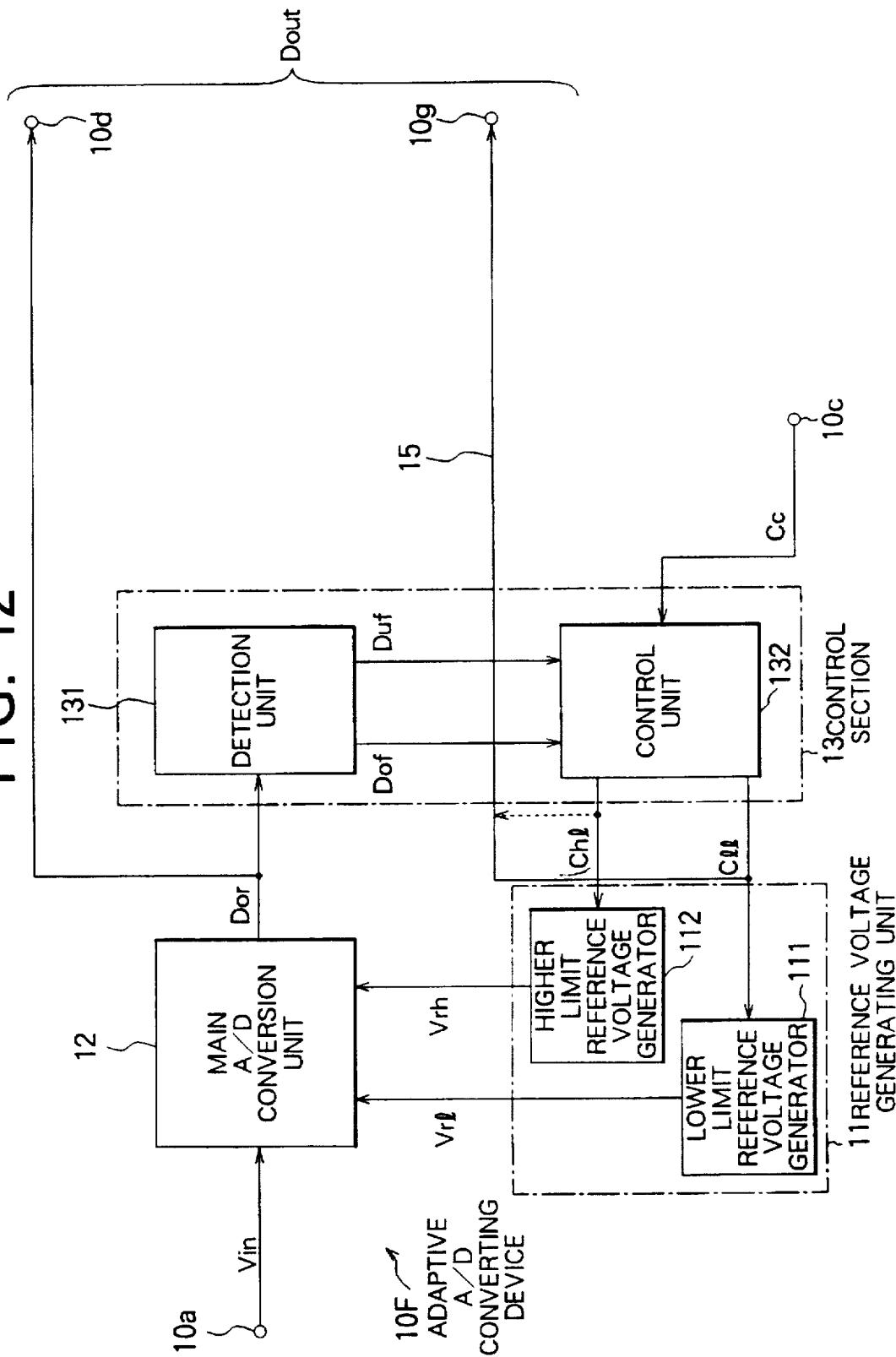
FIG. 12 is a block diagram of an adaptive A/D converting device according to a seventh embodiment of this invention.

Turning to FIG. 12, an adaptive A/D converting device 10F according to a seventh embodiment of this invention is similar in structure to that illustrated in FIG. 8 except that the calculation unit 142B is omitted from the adaptive A/D converting device 10B. The adaptive A/D converting device 10F has the original and a reference output terminal 10d and 10g. The reference output terminal 10g is for outputting the lower limit control signal Cll as the reference digital signal. A connection line 15 connecting the control unit 132 with the reference output terminal 10g acts as a reference digital signal production arrangement for producing the reference digital signal. A combination of the original and the reference output terminals 10d and 10g acts as an output arrangement for outputting the original digital signal Dor and the lower limit control signal Cll collectively as the output digital signal Dout which is delivered to the reception side (not shown). The reference output terminal 10g may be for outputting, as the reference digital signal, the higher limit control signal Chl instead of the lower limit control signal Cll as shown at a dotted line in FIG. 12.

Figure 13:
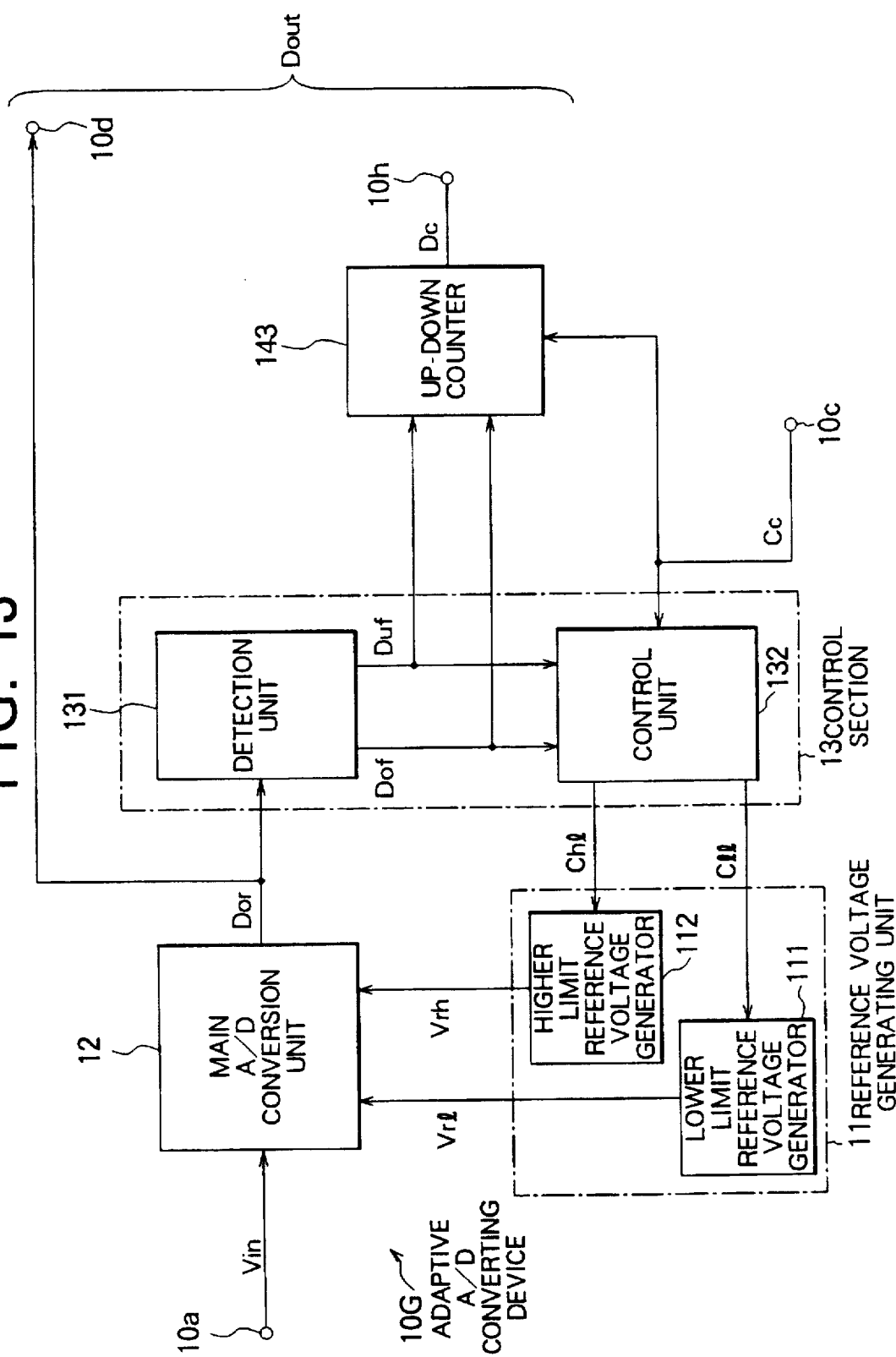
FIG. 13 is a block diagram of an adaptive A/D converting device according to an eighth embodiment of this invention.

Turning to FIG. 13, an adaptive A/D converting device 10G according to an eighth embodiment of this invention is similar in structure to that illustrated in FIG. 9 except that the calculation unit 142C is omitted from the adaptive A/D converting device 10C. The adaptive A/D converting device 10G has the original and a reference output terminal 10d and 10h. The reference output terminal 10h is for outputting the counter signal Dc as the reference digital signal. The up-down counter 143 acts as a reference digital signal production arrangement for producing the reference digital signal. A combination of the original and the reference output terminals 10d and 10h is operable as an output arrangement for outputting the original digital signal Dor and the counter signal Dc collectively as the output digital signal Dout which is delivered to the reception side (not shown).

In each of the above-mentioned embodiments, the control unit 132 immediately produces the lower and the higher limit control signals Cll and Chl in response to either the overflow detection signal Dof or the underflow detection signal Duf. However, there is a case where the input relative numerical value of the original digital signal Dor either exceeds the higher predetermined threshold numerical value Dthh in a instant or becomes smaller than the lower predetermined threshold numerical value Dthl in a instant. In this event, the control unit 132 frequently produces the lower and the higher limit control signals Cll and Chl.

Figure 14:
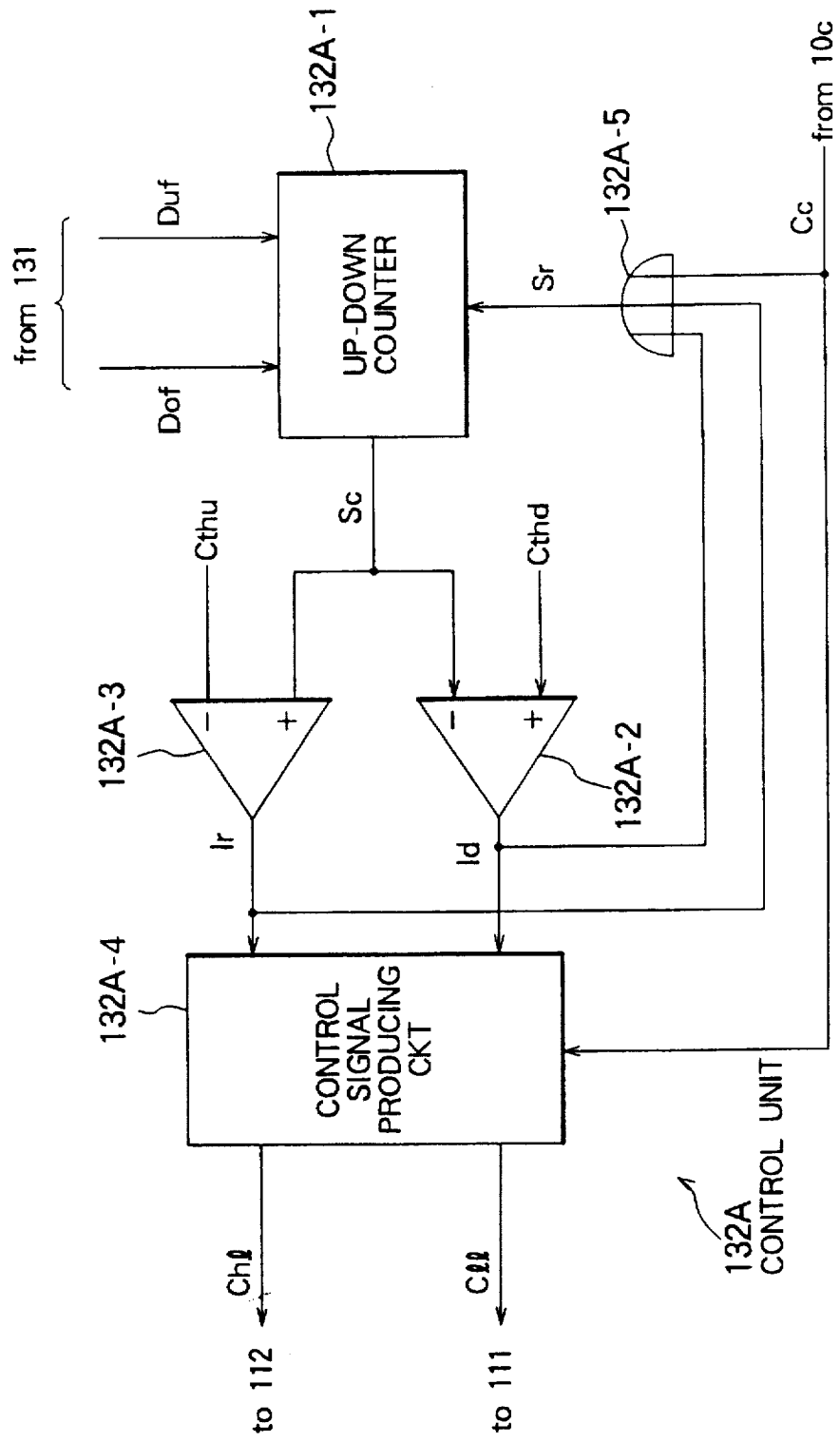
FIG. 14 is a block diagram of a modified control unit for use in the adaptive A/D converting devices illustrated in FIGS. 4, 7, 8, 10, 11, and 12.

To resolve such an inconvenience, the control unit 132 nay be modified into a modified control unit 132A as illustrated in FIG. 14.

The modified control unit 132A comprises an up-down counter 132A-1, first and second comparators 132A-2 and 132A-3, a control signal producing circuit 132A-4, and an OR circuit 132A-5. The up-down counter 132A-1 is connected to the detection unit 131 and the OR circuit 132A-5. In the manner which will become later clear, the OR circuit 132A-5 produces a reset signal Sr. Responsive to the reset signal Sr, the up-down counter 132A-1 is reset to produce a counter signal Sc indicative of a count of zero. Responsive to the overflow detection signal Dof, the up-down counter 132A-1 increments the count by one. Responsive to the underflow detection signal Duf, the up-down counter 132A-1 decrements the count by one. The counter signal Sc indicative of the count is supplied to input terminals of the first and the second comparators 132A-2 and 132A-3.

The first comparator 132A-2 has another input terminal supplied with a count-down limit threshold signal Cthd indicative of a count-down limit threshold count. The second comparator 132A-3 has another input terminal supplied with a count-up limit threshold signal Cthu indicative of a count-up limit threshold count. The first comparator 132A-2 compares the count of the counter signal Sc with the count-down limit threshold count while the second comparator 132A-3 compares the count of the counter signal Sc with the count-up limit threshold count. When the count of the counter signal Sc is not more than the count-down limit threshold count, the first comparator 132A-2 produces a drop indication signal Id indicative of a drop of the controllable reference voltage. When the count of the counter signal Sc is not less than the count-up limit threshold count, the second comparator 132A-3 produces a rise indication signal Ir indicative of a rise of the controllable reference voltage. The drop and the rise indication signals Id and Ir are supplied to the OR circuit 132A-5 and the control signal producing circuit 132A-4.

The OR circuit 132A-5 carries out an OR operation on the control command Cc and the drop and the rise indication signals Id and Ir to produce an OR'ed output signal as the reset signal. Therefore, the up-down counter 132A-1 is reset when one of the control command Cc and the drop and the rise indication signals Id and Ir is present.

The control signal producing circuit 132A-4 is supplied with the control command Cc. When the control command Cc indicates the control disable indication, the control signal producing circuit 132A-4 is put into a disable condition to produce the lower and the higher limit control signals Cll and Chl indicative of generation of the lower and the higher predetermined initial limit reference voltages, respectively. When the control command Cc indicates the control enable indication, the control signal producing circuit 132A-4 is put into an enable condition. Under the circumstances, the control signal producing circuit 132A-4 produces, in response to the rise indication signal Ir, the lower and the higher limit control signals Cll and Chl indicative of increasing of the lower and the higher limit reference voltages Vrl and Vrh, respectively. The control signal producing circuit 132A-4 produces, in response to the drop indication signal Id, the lower and the higher limit control signals Cll and Chl indicative of decreasing of the lower and the higher limit reference voltages Vrl and Vrh, respectively.

While this invention has thus far been described in conjunction with preferred embodiments thereof, it will now be readily possible for those skilled in the art to put this invention into various other manners. For example, the main A/D conversion unit 12 is not restricted to have a structure of the selective approximation type illustrated in FIG. 6, and may have a structure of, for example, an integral type or a flash type.

What is claimed is:

1. An adaptive analog-to-digital converting device for adaptively converting an input analog signal indicative of an input analog voltage into an output digital signal indicative of an output numerical value which corresponds to the input analog voltage, comprising:

a reference voltage generating unit for generating, as a controllable reference voltage, a pair of lower and higher limit reference voltages with a predetermined difference voltage kept therebetween in response to a control signal;

a main analog-to-digital conversion unit, supplied with the input analog signal and connected to said reference voltage generating unit, for converting, on the basis of the lower and the higher limit reference voltages, the input analog signal into an original digital signal indicative of an input relative numerical value which represents an input relative level deviated from an input reference level of the input analog signal, the original digital signal having a constant quantizing error; and a control section, connected to said main analog-to-digital conversion unit and said reference voltage generating unit, for controlling, on the basis of the original digital signal, the lower and the higher limit reference voltages by supplying the control signal to said reference voltage generating unit, whereby the input analog voltage of the input analog signal always lies in an observation allowable range defined between the lower and the higher limit reference voltages.

2. An adaptive analog-to-digital converting device as claimed in claim 1, wherein said control section produces, as the control signal, a pair of lower and higher limit control signals, said reference voltage generating unit comprising:

a lower limit reference voltage generator for generating the lower limit reference voltage in response to the lower limit control signal; and a higher limit reference voltage generator for generating the higher limit reference voltage in response to the higher limit control signal.

3. An adaptive analog-to-digital converting device as claimed in claim 2, further comprising:

reference digital signal production means, connected to said lower limit reference voltage generator, for producing, in response to the lower limit reference voltage, a reference digital signal indicative of a reference numerical value which represents the input reference level of the input analog signal; and output means, connected to said main analog-to-digital conversion unit and said reference digital signal production means, for outputting a combination of the original digital signal and the reference digital signal as the output digital signal.

4. An adaptive analog-to-digital converting device as claimed in claim 1, wherein said main analog-to-digital conversion unit has lower and higher limit reference voltage input terminals which are supplied with the lower and the higher limit reference voltages, respectively.

5. An adaptive analog-to-digital converting device as claimed in claim 1, wherein said control section comprises:

a detection unit connected to said main analog-to-digital conversion unit and having lower and higher predetermined threshold numerical values which define lower and higher relative threshold levels, respectively, the lower relative threshold level being lower than the higher relative threshold level, said detection unit compares the input relative numerical value with the lower and the higher predetermined threshold numerical values, said detection unit producing an overflow detection signal when the input relative numerical value exceeds the higher predetermined threshold numerical value, said detection unit producing an underflow detection signal when the input relative numerical value becomes smaller than the lower predetermined threshold numerical value; and a control unit, connected to said detection unit and said reference voltage generating unit, for controlling, in response to the overflow detection signal, said reference voltage generating unit so as to increase the lower and the higher limit reference voltages and for controlling, in response to the underflow detection signal, said reference voltage generating unit so as to decrease the lower and the higher limit reference voltages.

6. An adaptive analog-to-digital converting device as claimed in claim 5, wherein said control unit has a control input terminal supplied with a control command indicative of one of a control enable indication and a control disable indication at a time, when the control command indicates the control disable indication, said control unit being put into a control disable condition to make said reference voltage generating unit generate lower and higher predetermined initial limit reference voltages as the lower and the higher limit reference voltages, respectively, thereby restricting the observation allowable range to a fixed observation range defined between the lower and the higher predetermined initial limit reference voltages.

7. An adaptive analog-to-digital converting device as claimed in claim 5, further comprising:

reference digital signal production means, connected to said detection unit, for producing, in response to the underflow and the overflow detection signals, a reference digital signal indicative of a reference numerical value which represents the input reference level of the input analog signal; and output means, connected to said main analog-to-digital conversion unit and said reference digital signal production means, for outputting a combination of the original digital signal and the reference digital signal as the output digital signal.

8. An adaptive analog-to-digital converting device as claimed in claim 7, wherein said reference digital signal production means comprises an up-down counter, connected to said detection unit, for carrying out an up-down counting operation, said up-down counter counting up a count in response to the overflow detection signal to incremented by one, said up-down counter counting down the count in response to the underflow detection signal to decremented by one, said up-down counter producing a counter output signal indicative of the count as the reference digital signal.

9. An adaptive analog-to-digital converting device as claimed in claim 1, further comprising:

reference digital signal production means, connected to said reference voltage generating unit, for producing, in response to the controllable reference voltage, a reference digital signal indicative of a reference numerical value which represents the input reference level of the input analog signal; and output means, connected to said main analog-to-digital conversion unit and said reference digital signal production means, for outputting a combination of the original digital signal and the reference digital signal as the output digital signal.

10. An adaptive analog-to-digital converting device as claimed in claim 9, wherein said reference digital signal production means comprises a subsidiary analog-to-digital conversion section, connected to said reference voltage generating unit, for converting the controllable reference voltage into the reference digital signal.

11. An adaptive analog-to-digital converting device as claimed in claim 1, further comprising:

reference digital signal production means, connected to said control section, for producing the control signal as a reference digital signal indicative of a reference numerical value which represents the input reference level of the input analog signal; and output means, connected to said main analog-to-digital conversion unit and said reference digital signal production means, for outputting a combination of the original digital signal and the reference digital signal as the output digital signal.

12. An adaptive analog-to-digital converting device for adaptively converting an input analog signal indicative of an input analog voltage into an output digital signal indicative of an output numerical value which corresponds to the input analog voltage, comprising:

a base voltage generating unit for generating a controllable base voltage in response to a control signal;

a main analog-to-digital conversion unit, supplied with the input analog signal and connected to said base voltage generating unit, for converting, on the basis of the controllable base voltage, the input analog signal into a virtual digital signal indicative of an input virtual numerical value which represents an input virtual level of the input analog signal;

a control section, connected to said main analog-to-digital conversion unit and said base voltage generating unit, for controlling, on the basis of the virtual digital signal, the controllable base voltage by supplying the control signal to said base voltage generating unit; and a translating section, connected to said main analog-to-digital conversion unit and said base voltage generating unit, for translating, on the basis of the controllable base voltage, the virtual digital signal into a real digital signal indicative of an input real numerical value which represents a real level of the input analog signal, said translating section producing the real digital signal as the output digital signal, thereby apparently expanding a dynamic range of said adaptive analog-to-digital converting device.

13. An adaptive analog-to-digital converting device for adaptively converting an input analog signal indicative of an input analog voltage into an output digital signal indicative of an output numerical value which corresponds to the input analog voltage, comprising:

a bias voltage generating unit for generating a controllable bias voltage in response to a control signal;

a main analog-to-digital conversion unit, supplied with the input analog signal and connected to said bias voltage generating unit, for converting, on the basis of the controllable bias voltage, the input analog signal into a logical digital signal indicative of an input logical numerical value which represents an input logical level of the input analog signal;

a control section, connected to said main analog-to-digital conversion unit and said bias voltage generating unit, for controlling, on the basis of the logical digital signal, the controllable bias voltage by supplying the control signal to said bias voltage generating unit; and a converting section, connected to said main analog-to-digital conversion unit and said bias voltage generating unit, for converting, on the basis of the controllable bias voltage, the logical digital signal into a physical digital signal indicative of an input physical numerical value which represents a physical level of the input analog signal, said converting section producing the physical digital signal as the output digital signal, thereby apparently expanding a dynamic range of said adaptive analog-to-digital converting device.

14. An adaptive analog-to-digital converting device for adaptively converting an input analog signal indicative of an input analog voltage into an output digital signal indicative of an output numerical value which corresponds to the input analog voltage, comprising:

a reference voltage generating unit for generating, as a controllable reference voltage, a pair of lower and higher limit reference voltages with a predetermined difference voltage kept therebetween in response to a control signal;

a main analog-to-digital conversion unit, supplied with the input analog signal and connected to said reference voltage generating unit, for converting, on the basis of the lower and the higher limit reference voltages, the input analog signal into an original digital signal indicative of an input relative numerical value which represents an input relative level deviated from an input reference level of the input analog signal, the original digital signal having a constant quantizing error;

a control section, connected to said main analog-to-digital conversion unit and said reference voltage generating unit, for controlling, on the basis of the original digital signal, the lower and the higher limit reference voltages by supplying the control signal to said reference voltage generating unit, whereby the input analog voltage of the input analog signal always lies in an observation allowable range defined between the lower and the higher limit reference voltages; and a modifying section connected to said main analog-to-digital conversion unit and said reference voltage generating unit, said modifying section modifying, on the basis of the controllable reference voltage, the original digital signal into a modified digital signal indicative of an input absolute numerical value which represents an input absolute level of the input analog signal, the input absolute level being equal to the input relative level plus the input reference level, said modifying section producing the modified digital signal as the output digital signal, whereby said adaptive analog-to-digital converting device always produces the output digital signal having the constant quantizing error although the input analog signal has an amplitude which changes drastically, thereby apparently expanding a dynamic range of said adaptive analog-to-digital converting device.

15. An adaptive analog-to-digital converting device as claimed in claim 14, wherein said modifying section comprises:

a subsidiary analog-to-digital conversion section, connected to said reference voltage generating unit, for converting the controllable reference voltage into a reference digital singal indicative of a reference numerical value which represents the input reference level of the input analog signal; and a calculation unit, connected to said main analog-to-digital conversion unit and said subsidiary analog-to-digital conversion section, for calculating the input absolute numerical value of the input analog signal using the relative numerical value on the basis of the reference numerical value to produce a calculated digital signal indicative of the input absolute numerical value as the output digital signal.

16. An adaptive analog-to-digital converting device as claimed in claim 15, wherein said subsidiary analog-to-digital conversion section comprises:

a first subsidiary analog-to-digital conversion unit, connected to said reference voltage generating unit, for converting the lower limit reference voltage into a lower limit reference digital signal as a part of the reference digital signal; and a second subsidiary analog-to-digital conversion unit, connected to said reference voltage generating unit, for converting the higher limit reference voltage into a higher limit reference digital signal as another part of the reference digital signal.

17. An adaptive analog-to-digital converting device for adaptively converting an input analog signal indicative of an input analog voltage into an output digital signal indicative of an output numerical value which corresponds to the input analog voltage, comprising:

a reference voltage generating unit for generating, as a controllable reference voltage, a pair of lower and higher limit reference voltages with a predetermined difference voltage kept therebetween in response to a control signal;

a main analog-to-digital conversion unit, supplied with the input analog signal and connected to said reference voltage generating unit, for converting, on the basis of the lower and the higher limit reference voltages, the input analog signal into an original digital signal indicative of an input relative numerical value which represents an input relative level deviated from an input reference level of the input analog signal, the original digital signal having a constant quantizing error;

a control section, connected to said main analog-to-digital conversion unit and said reference voltage generating unit, for controlling, on the basis of the original digital signal, the lower and the higher limit reference voltages by supplying the control signal to said reference voltage generating unit, whereby the input analog voltage of the input analog signal always lies in an observation allowable range defined between the lower and the higher limit reference voltages, said control section producing, as the control signal, a pair of lower and higher limit control signals, said reference voltage generating unit comprising: a lower limit reference voltage generator for generating the lower limit reference voltage in response to the lower limit control signal; and a higher limit reference voltage generator for generating the higher limit reference voltage in response to the higher limit control signal; and a modifying section connected to said main analog-to-digital conversion unit and said lower limit reference voltage generator, said modifying section modifying, on the basis of the lower limit reference voltage, the original digital signal into a modified digital signal indicative of an input absolute numerical value which represents an absolute level of the input analog signal, the input absolute level being equal to the input relative level plus the input reference level, said modifying section producing the modified digital signal as the output digital signal, whereby said adaptive analog-to-digital converting device always produces the output digital signal having the constant quantizing error although the input analog signal has an amplitude which changes drastically, thereby apparently expanding a dynamic range of said adaptive analog-to-digital converting device.

18. An adaptive analog-to-digital converting device as claimed in claim 17, wherein said modifying section comprises:

a subsidiary analog-to-digital conversion unit, connected to said lower limit reference voltage generator, for converting the lower limit reference voltage into a lower limit reference digital signal indicative of a lower limit reference numerical value which represents the input reference level of the input analog signal; and a calculation unit, connected to said main and said subsidiary analog-to-digital conversion units, for calculating the input absolute numerical value of the input analog signal using the relative numerical value on the basis of the lower limit reference numerical value to produce a calculated digital signal indicative of the input absolute numerical value as the output digital signal.

19. An adaptive analog-to-digital converting device for adaptively converting an input analog signal indicative of an input analog voltage into an output digital signal indicative of an output numerical value which corresponds to the input analog voltage, comprising:

a reference voltage generating unit for generating, as a controllable reference voltage, a pair of lower and higher limit reference voltages with a predetermined difference voltage kept therebetween in response to a control signal;

a main analog-to-digital conversion unit, supplied with the input analog signal and connected to said reference voltage generating unit, for converting, on the basis of the lower and the higher limit reference voltages, the input analog signal into an original digital signal indicative of an input relative numerical value which represents an input relative level deviated from an input reference level of the input analog signal, the original digital signal having a constant quantizing error;

a control section, connected to said main analog-to-digital conversion unit and said reference voltage generating unit, for controlling, on the basis of the original digital signal, the lower and the higher limit reference voltages by supplying the control signal to said reference voltage generating unit, whereby the input analog voltage of the input analog signal always lies in an observation allowable range defined between the lower and the higher limit reference voltages; and a modifying section connected to said main analog-to-digital conversion unit and said control section, said modifying section modifying, on the basis of control signal, the original digital signal into a modified digital signal indicative of an input absolute numerical value which represents an absolute level of the input analog signal, the input absolute level being equal to the input relative level plus the input reference level, said modifying section producing the modified digital signal as the output digital signal, whereby said adaptive analog-to-digital converting device always produces the output digital signal having the constant quantizing error although the input analog signal has an amplitude which changes drastically, thereby apparently expanding a dynamic range of said adaptive analog-to-digital converting device.

20. An adaptive analog-to-digital converting device as claimed in claim 19, wherein said modifying section comprises a calculation unit, connected to said main analog-to-digital conversion unit and said control section, for calculating the input absolute numerical value of the input analog signal using the relative numerical value on the basis of the control signal to produce a calculated digital signal indicative of the input absolute numerical value as the output digital signal.

21. An adaptive analog-to-digital converting device for adaptively converting an input analog signal indicative of an input analog voltage into an output digital signal indicative of an output numerical value which corresponds to the input analog voltage, comprising:

a reference voltage generating unit for generating, as a controllable reference voltage, a pair of lower and higher limit reference voltages with a predetermined difference voltage kept therebetween in response to a control signal, said reference voltage generating unit comprising a lower limit reference voltage generator for generating the lower limit reference voltage in response to the lower limit control signal and a higher limit reference voltage generator for generating the higher limit reference voltage in response to the higher limit control signal;

a main analog-to-digital conversion unit, supplied with the input analog signal and connected to said reference voltage generating unit, for converting, on the basis of the lower and the higher limit reference voltages, the input analog signal into an original digital signal indicative of an input relative numerical value which represents an input relative level deviated from an input reference level of the input analog signal, the original digital signal having a constant quantizing error;

a control section, connected to said main analog-to-digital conversion unit and said reference voltage generating unit, for controlling, on the basis of the original digital signal, the lower and the higher limit reference voltages by supplying the control signal to said reference voltage generating unit, whereby the input analog voltage of the input analog signal always lies in an observation allowable range defined between the lower and the higher limit reference voltages, said control section producing, as the control signal, a pair of lower and higher limit control signals, said control section comprising a detection unit connected to said main analog-to-digital conversion unit and having lower and higher predetermined threshold numerical values which define lower and higher relative threshold levels, respectively, the lower relative threshold level being lower than the higher relative threshold level, said detection unit compares the input relative numerical value with the lower and the higher predetermined threshold numerical values, said detection unit producing an overflow detection signal when the input relative numerical value exceeds the higher predetermined threshold numerical value, said detection unit producing an underflow detection signal when the input relative numerical value becomes smaller than the lower predetermined threshold numerical value; and a control unit, connected to said detection unit and said reference voltage generating unit, for controlling, in response to the overflow detection signal, said reference voltage generating unit so as to increase the lower and the higher limit reference voltage and for controlling, in response to the underflow detection signal, said reference voltage generating unit so as to decrease the lower and the higher limit reference voltages; and a modifying section connected to said main analog-to-digital conversion unit and said detection unit, said modifying section modifying, on the basis of the underflow and the overflow detection signals, the original digital signal into a modified digital signal indicative of an input absolute numerical value which represents an absolute level of the input analog signal, the input absolute level being equal to the input relative level plus the input reference level, said modifying section producing the modified digital signal as the output digital signa, whereby said adaptive analog-to-digital converting device always produces the output digital signal having the constant quantizing error although the input analog signal has an amplitude which changes drastically, thereby apparently expanding a dynamic range of said adaptive analog-to-digital converting device.

22. An adaptive analog-to-digital converting device as claimed in claim 21, wherein said modifying section comprises:

an up-down counter, connected to said detection unit, for carrying out an up-down counting operation, said up-down counter counting up a count in response to the overflow detection signal to incremented by one, said up-down counter counting down the count in response to the underflow detection signal to decremented by one, said up-down counter producing a counter output signal indicative of the count; and a calculation unit, connected to said main analog-to-digital conversion unit and said up-down counter, for calculating the input absolute numerical value of the input analog signal using the relative numerical value on the basis of the counter output signal to produce a calculated digital signal indicative of the input absolute numerical value as the output digital signal.

23. An adaptive analog-to-digital converting device for adaptively converting an input analog signal indicative of an input analog voltage into an output digital signal indicative of an output numerical value which corresponds to the input analog voltage, comprising:

a reference voltage generating unit for generating, as a controllable reference voltage, a pair of lower and higher limit reference voltages with a predetermined difference voltage kept therebetween in response to a control signal;

a main analog-to-digital conversion unit, supplied with the input analog signal and connected to said reference voltage generating unit, for converting, on the basis of the lower and the higher limit reference voltages, the input analog signal into an original digital signal indicative of an input relative numerical value which represents an input relative level deviated from an input reference level of the input analog signal, the original digital signal having a constant quantizing error;

a control section, connected to said main analog-to-digital conversion unit and said reference voltage generating unit, for controlling, on the basis of the original digital signal, the lower and the higher limit reference voltages by supplying the control signal to said reference voltage generating unit, whereby the input analog voltage of the input analog signal always lies in an observation allowable range defined between the lower and the higher limit reference voltages;

reference digital signal production means, connected to said reference voltage generating unit, for producing, in response to the controllable reference voltage, a reference digital signal indicative of a reference numerical value which represents the input reference level of the input analog signal, said reference digital signal production means comprising a subsidiary analog-to-digital conversion section, connected to said reference voltage generating unit, for converting the controllable reference voltage into the reference digital signal;

said subsidiary analog-to-digital conversion section comprising a first subsidiary analog-to-digital conversion unit, connected to said reference voltage generating unit, for converting the lower limit reference voltage into a lower limit reference digital signal as a part of the reference digital signal; and a second subsidiary analog-to-digital conversion unit, connected to said reference voltage generating unit, for converting the higher limit reference voltage into a higher limit reference digital signal as another part of the reference digital signal; and output means, connected to said main analog-to-digital conversion unit and said reference digital signal production means, for outputting a combination of the original digital signal and the reference digital signal as the output digital signal.

24. An adaptive analog-to-digital converting device for adaptively converting an input analog signal indicative of an input analog voltage into an output digital signal indicative of an output numerical value which corresponds to the input analog voltage, comprising:

a reference voltage generating unit for generating, as a controllable reference voltage, a pair of lower and higher limit reference voltages with a predetermined difference voltage kept therebetween in response to a control signal;

a main analog-to-digital conversion unit, supplied with the input analog signal, and connected to said reference voltage generating unit, for converting, on the basis of the lower and the higher limit reference voltages, the input analog signal into an original digital signal indicative of an input relative numerical value which represents an input relative level deviated from an input reference level of the input analog signal, the original digital signal having a constant quantizing error;

a control section, connected to said main analog-to-digital conversion unit and said reference voltage generating unit, for controlling, on the basis of the original digital signal, the lower and the higher limit reference voltages by supplying the control signal to said reference voltage generating unit, whereby the input analog voltage of the input analog signal always lies in an observation allowable range defined between the lower and the higher limit reference voltages; said control section producing, as the control signal, a pair of lower and higher limit control signals, said reference voltage generating unit comprising: a lower limit reference voltage generator for generating the lower limit reference voltage in response to the higher limit control signal; and reference digital signal production means, connected to said lower limit reference voltage generator, for producing, in response to the lower limit reference voltage, a reference digital signal indicative of a reference numerical value which represents the input reference level of the input analog signal, said reference digital signal production means comprising a subsidiary analog-to-digital conversion unit, connected to said lower limit reference voltage generator, for converting the lower limit reference voltage into a lower limit reference digital signal indicative of a lower limit reference numerical value, said subsidiary analog-to-digital conversion unit producing the lower limit reference digital signal as the reference digital signal; and output means, connected to said main analog-to-digital conversion unit and said reference digital signal production means, for outputting a combination of the original digital signal and the reference digital signal as the output digital signal.

* * * * *